United States Patent
Kawanami

(10) Patent No.: US 10,274,524 B2
(45) Date of Patent: Apr. 30, 2019

(54) CURRENT SENSOR INCLUDING A FIRST FLOW PATH PORTION AND A SECOND FLOW PATH FOLDER AND POWER CONVERSION APPARATUS INCLUDING THE SAME

(71) Applicant: Murata Manufacturing Co., Ltd., Nagaokakyo-shi, Kyoto-fu (JP)

(72) Inventor: Takashi Kawanami, Nagaokakyo (JP)

(73) Assignee: MURATA MANUFACTURING CO., LTD., Kyoto (JP)

( * ) Notice: Subject to any disclaimer, the term of this patent is extended or adjusted under 35 U.S.C. 154(b) by 0 days.

(21) Appl. No.: 15/908,858

(22) Filed: Mar. 1, 2018

(65) Prior Publication Data
US 2018/0188294 A1    Jul. 5, 2018

Related U.S. Application Data

(63) Continuation of application No. PCT/JP2016/075955, filed on Sep. 5, 2016.

(30) Foreign Application Priority Data

Oct. 8, 2015  (JP) ................................. 2015-200285

(51) Int. Cl.
  *G01R 15/20*  (2006.01)
  *G01R 19/00*  (2006.01)
  (Continued)

(52) U.S. Cl.
  CPC ......... *G01R 15/207* (2013.01); *G01R 15/202* (2013.01); *G01R 15/205* (2013.01);
  (Continued)

(58) Field of Classification Search
  CPC combination set(s) only.
  See application file for complete search history.

(56) References Cited

U.S. PATENT DOCUMENTS

| 6,515,468 B1 * | 2/2003 | Morimoto ............ G01R 15/207 324/117 H |
|---|---|---|
| 2016/0033557 A1 | 2/2016 | Hwangbo |

FOREIGN PATENT DOCUMENTS

| JP | 09-304440 A | 11/1997 |
|---|---|---|
| JP | 2005-283451 A | 10/2005 |
| | (Continued) | |

OTHER PUBLICATIONS

Official Communication issued in International Patent Application No. PCT/JP2016/075955, dated Nov. 8, 2016.

*Primary Examiner* — Jay Patidar
(74) *Attorney, Agent, or Firm* — Keating & Bennett, LLP

(57) ABSTRACT

A conductor includes a first flow path portion and a second flow path portion through which a current as a measurement target flows in a branched manner at a halfway position in a lengthwise direction of the conductor. The first flow path portion and the second flow path portion are located with a space therebetween in the width direction of the conductor when viewed from the thickness direction of the conductor. A region surrounded by the first flow path portion and the second flow path portion is provided when viewed from the width direction of the conductor. At least a portion of a substrate is located in the region and opposes at least one of the first flow path portion and the second flow path portion when viewed from the width direction of the conductor. The first magnetic sensor and the second magnetic sensor are arranged in the space.

18 Claims, 18 Drawing Sheets

(51) Int. Cl.
 *H02M 7/48* (2007.01)
 *H02M 1/00* (2006.01)
(52) U.S. Cl.
 CPC ........... *G01R 19/0092* (2013.01); *H02M 7/48* (2013.01); *H02M 2001/0009* (2013.01)

(56) References Cited

FOREIGN PATENT DOCUMENTS

| | | | |
|---|---|---|---|
| JP | 2007-078418 | A | 3/2007 |
| JP | 2008-039734 | A | 2/2008 |
| JP | 2015-175757 | A | 10/2015 |
| WO | 2015/115238 | A1 | 8/2015 |
| WO | 2015/115472 | A1 | 8/2015 |

* cited by examiner

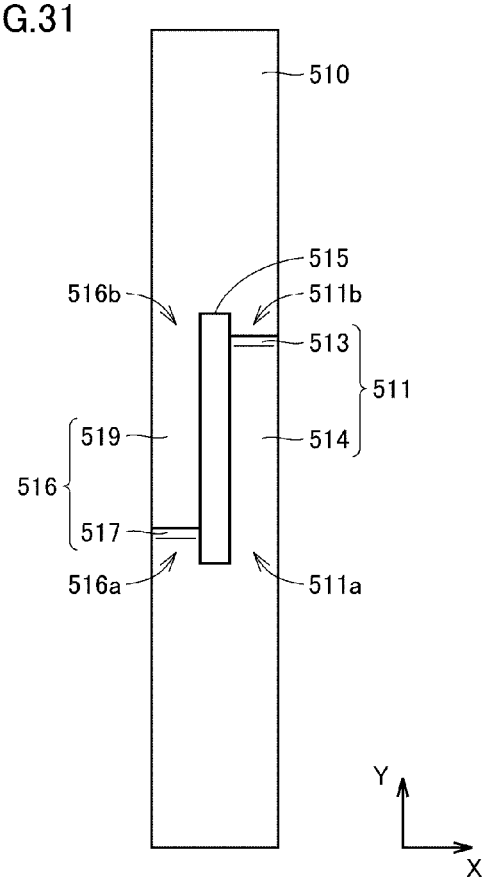
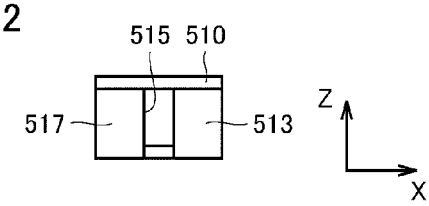

CURRENT SENSOR INCLUDING A FIRST FLOW PATH PORTION AND A SECOND FLOW PATH FOLDER AND POWER CONVERSION APPARATUS INCLUDING THE SAME

CROSS REFERENCE TO RELATED APPLICATIONS

This application claims the benefit of priority to Japanese Patent Application No. 2015-200285 filed on Oct. 8, 2015 and is a Continuation Application of PCT Application No. PCT/JP2016/075955 filed on Sep. 5, 2016. The entire contents of each application are hereby incorporated herein by reference.

BACKGROUND OF THE INVENTION

1. Field of the Invention

The present invention relates to a current sensor and a power conversion apparatus including the same, and relates to a current sensor that detects a value of a measurement target current by measuring a magnetic field generated in accordance with the measurement target current and a power conversion apparatus including the same.

2. Description of the Related Art

Japanese Unexamined Patent Application Publication No. 2007-78418 discloses a configuration of a known current sensor. In the current sensor disclosed in Japanese Unexamined Patent Application Publication No. 2007-78418, an integrated chip is interposed between two parallel lines defined by busbars. The integrated chip is arranged in a stepped space provided between the two lines such that the lines are located at the front side or the lines are located at the rear side. Magnetism detection elements mounted on the integrated chip respectively detect magnetic vectors in opposite directions, which are generated by flows of currents through the two lines (currents flowing in the same direction through the respective lines).

In the current sensor disclosed in FIG. 8 in Japanese Unexamined Patent Application Publication No. 2007-78418, the integrated chip is arranged perpendicularly to the lines and projects relative to the two lines in the up-down direction to inhibit a reduction of the current sensor in height. In the current sensor disclosed in FIG. 2 in Japanese Unexamined Patent Application Publication No. 2007-78418, the integrated chip is arranged in parallel with the lines and the magnetism detection elements detect magnetism in parallel with a chip surface. Therefore, when the currents flowing through primary conductors that are the busbars are alternating currents, as frequencies of the currents are higher, a rising time of an output of the current sensor is increased and a measurement error of the current sensor is increased.

SUMMARY OF THE INVENTION

Preferred embodiments of the present invention provide current sensors with preferable frequency characteristics and reduced heights, and power conversion apparatuses including the same.

A current sensor according to a preferred embodiment of the present invention includes a conductor through which an electric current as a measurement target flows and that includes a front surface and a rear surface, a lengthwise direction, a width direction orthogonal or substantially orthogonal to the lengthwise direction, and a thickness direction orthogonal or substantially orthogonal to the lengthwise direction and the width direction, a first magnetic sensor and a second magnetic sensor that detect an intensity of a magnetic field generated by the current flowing through the conductor, and a substrate on which the first magnetic sensor and the second magnetic sensor are mounted. The conductor includes a first flow path portion and a second flow path portion through which the current flows in a branched manner at a halfway position in the lengthwise direction. The first flow path portion and the second flow path portion are located with a space therebetween in the width direction when viewed from the thickness direction. A region surrounded by the first flow path portion and the second flow path portion is provided when viewed from the width direction. At least a portion of the substrate is located inside the region and opposes at least one of the first flow path portion and the second flow path portion when viewed from the width direction. The first magnetic sensor and the second magnetic sensor are arranged in the space.

In a preferred embodiment of the present invention, the first magnetic sensor is mounted on one main surface of the substrate, and the second magnetic sensor is mounted on the other main surface of the substrate.

In a preferred embodiment of the present invention, the first flow path portion projects towards the front surface side of the conductor when viewed from the width direction.

In a preferred embodiment of the present invention, the second flow path portion projects towards the rear surface side of the conductor when viewed from the width direction.

In a preferred embodiment of the present invention, each of the first flow path portion and the second flow path portion includes one end and another end in the lengthwise direction. Positions of the one end of the first flow path portion and the other end of the first flow path portion in the lengthwise direction are different from each other in the thickness direction. Positions of the one end of the second flow path portion and the other end of the second flow path portion in the lengthwise direction are different from each other in the thickness direction. The positions of the one end of the first flow path portion and the one end of the second flow path portion in the lengthwise direction are the same or substantially the same as each other in the thickness direction. The positions of the other end of the first flow path portion and the other end of the second flow path portion in the lengthwise direction are the same or substantially the same as each other in the thickness direction. The first flow path portion includes a bent portion connecting the one end of the first flow path portion and the other end of the first flow path portion in the thickness direction. The second flow path portion includes a bent portion connecting the one end of the second flow path portion and the other end of the second flow path portion in the thickness direction. The bent portion of the first flow path portion and the bent portion of the second flow path portion are located with a space between the bent portions in the lengthwise direction.

In a preferred embodiment of the present invention, the first magnetic sensor overlaps with at least a portion of the first flow path portion when viewed from the width direction. The second magnetic sensor overlaps with at least a portion of the second flow path portion when viewed from the width direction.

In a preferred embodiment of the present invention, the first magnetic sensor and the second magnetic sensor overlap with each other when viewed from the thickness direction.

In a preferred embodiment of the present invention, a space between the first magnetic sensor and the first flow path portion and a space between the second magnetic sensor and the second flow path portion are equal or substantially equal to each other in the width direction. The first magnetic sensor and the second magnetic sensor are located so as to deviate from each other in the lengthwise direction when viewed from the thickness direction.

In a preferred embodiment of the present invention, the current sensor further includes a calculator that calculates a value of the current using a detection value of the first magnetic sensor and a detection value of the second magnetic sensor. A phase of the detection value of the first magnetic sensor and a phase of the detection value of the second magnetic sensor are opposite to each other for the intensity of the magnetic field generated by the current flowing through the conductor. The calculator is preferably a subtractor or a differential amplifier.

In a preferred embodiment of the present invention, the current sensor further includes a calculator that calculates a value of the current using a detection value of the first magnetic sensor and a detection value of the second magnetic sensor. A phase of the detection value of the first magnetic sensor and a phase of the detection value of the second magnetic sensor are the same as each other for the intensity of the magnetic field generated by the current flowing through the conductor. The calculator is preferably an adder or a summing amplifier.

In a preferred embodiment of the present invention, the calculator is mounted on at least one of one main surface of the substrate and another main surface of the substrate. The calculator overlaps with at least one of the first flow path portion and the second flow path portion in the thickness direction.

In a preferred embodiment of the present invention, preferably, each of the first magnetic sensor and the second magnetic sensor includes a Hall element.

In a preferred embodiment of the present invention, preferably, each of the first magnetic sensor and the second magnetic sensor includes a magnetoresistive element.

A power conversion apparatus according to a preferred embodiment of the present invention includes a current sensor according to a preferred embodiment of the present invention.

According to preferred embodiments of the present invention, current sensors are provided with preferable frequency characteristics and reduced heights.

The above and other elements, features, steps, characteristics and advantages of the present invention will become more apparent from the following detailed description of the preferred embodiments with reference to the attached drawings.

BRIEF DESCRIPTION OF THE DRAWINGS

FIG. 31 is a top view when the primary conductor in FIG. 29 is viewed along a direction of an arrow XXXI.

FIG. 32 is a front view when the primary conductor in FIG. 29 is viewed along a direction of an arrow XXXII.

DETAILED DESCRIPTION OF THE PREFERRED EMBODIMENTS

Figure 1:
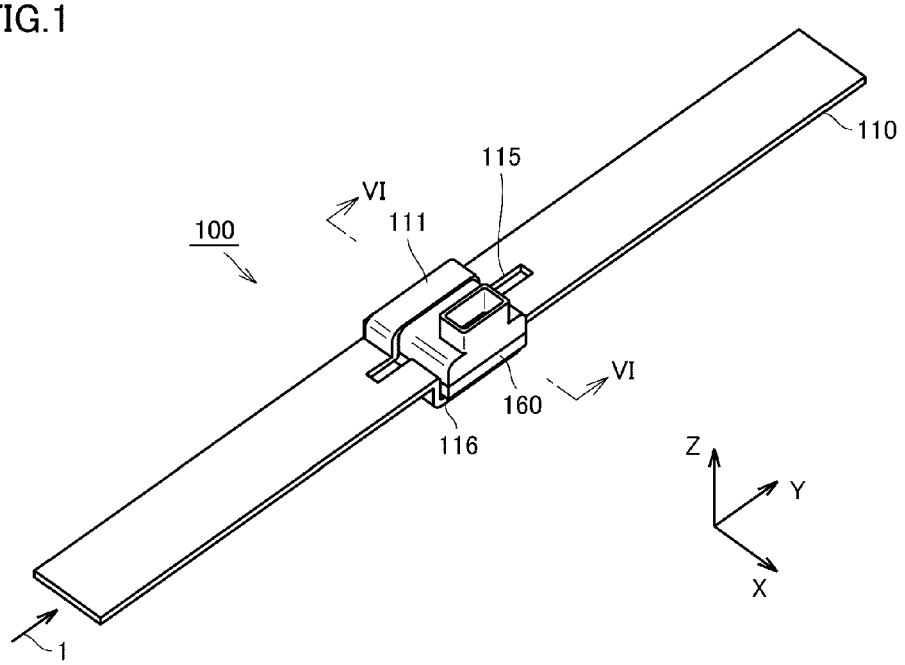
FIG. 1 is a perspective view illustrating an outer appearance of a current sensor according to a first preferred embodiment of the present invention.

Hereinafter, current sensors and power conversion apparatuses including the same according to preferred embodiments of the present invention will be described with reference to the drawings. In the following description of the preferred embodiments, the same reference characters denote the same or equivalent portions in the drawings and description thereof is not repeated.

First Preferred Embodiment

Figure 2:
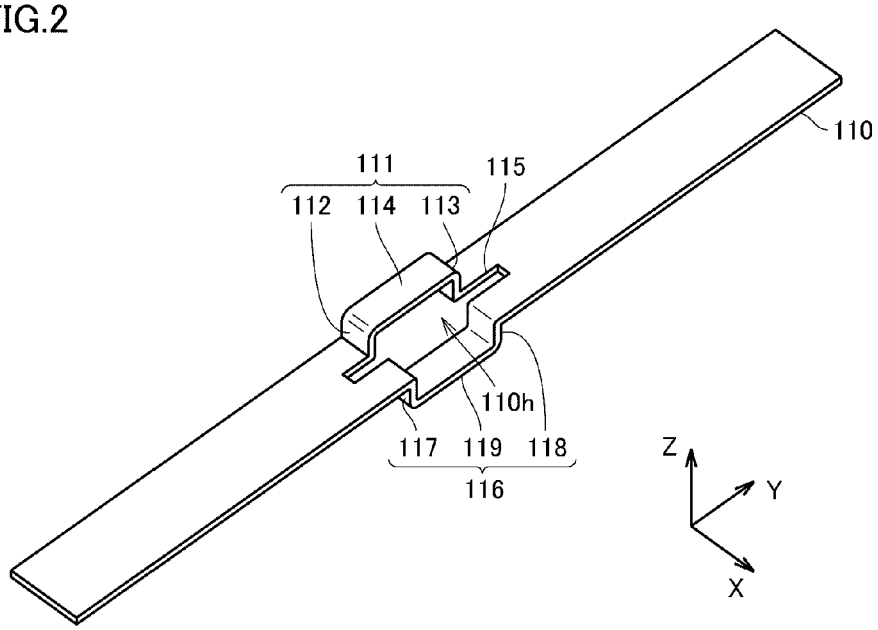
FIG. 2 is a perspective view illustrating an outer appearance of a primary conductor included in the current sensor in the first preferred embodiment of the present invention.
Figure 3:
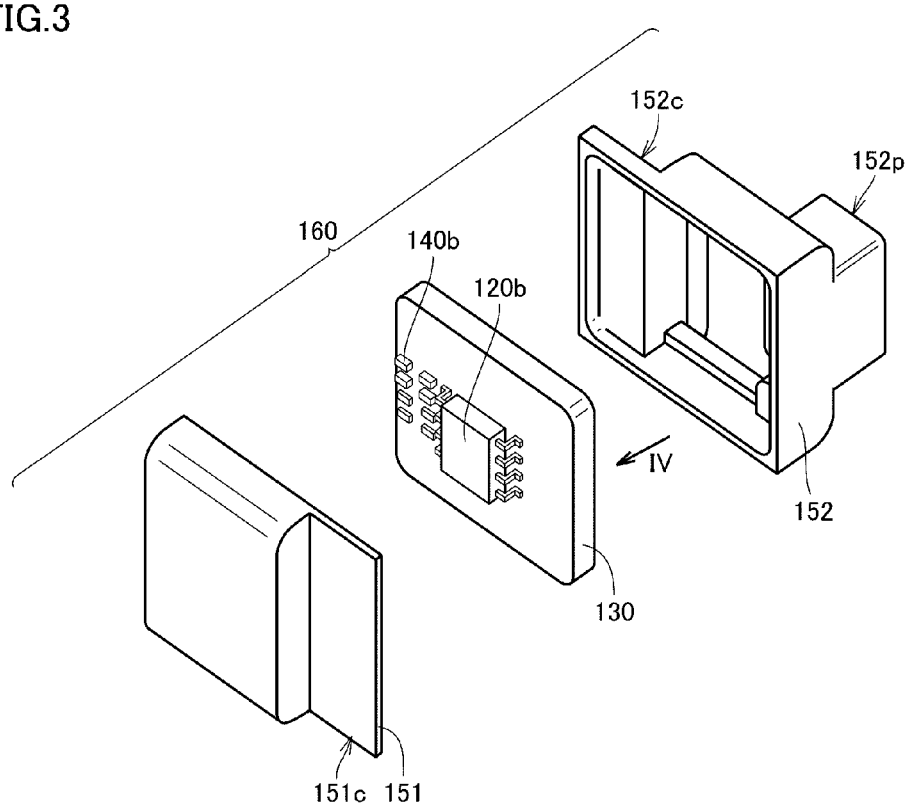
FIG. 3 is an exploded perspective view illustrating the configuration of a magnetic sensor unit included in the current sensor in the first preferred embodiment of the present invention.
Figure 4:
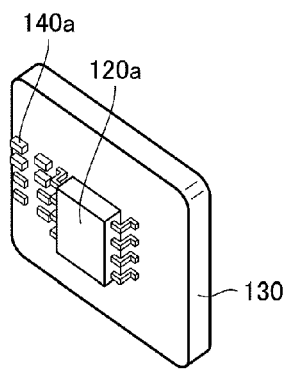
FIG. 4 is a perspective view when a substrate in the magnetic sensor unit included in the current sensor in the first preferred embodiment of the present invention is viewed from a IV direction in FIG. 3.
Figure 5:
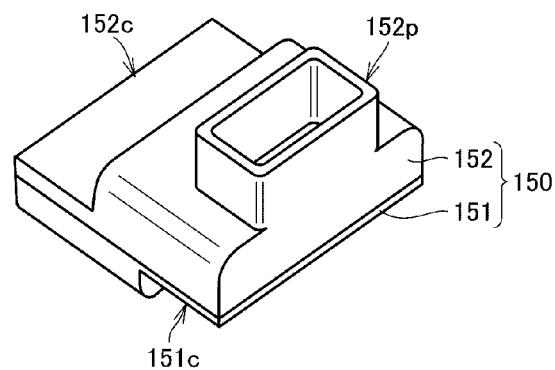
FIG. 5 is a perspective view illustrating an outer appearance of a housing of the magnetic sensor unit included in the current sensor in the first preferred embodiment of the present invention.
Figure 6:
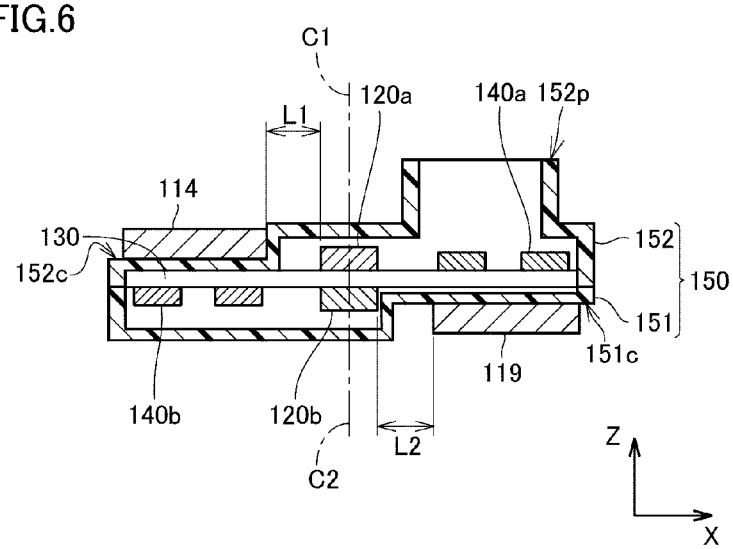
FIG. 6 is a cross-sectional view of the current sensor in the first preferred embodiment of the present invention when the current sensor is viewed along a direction of an arrow VI-VI in FIG. 1.

FIG. 1 is a perspective view illustrating an outer appearance of a current sensor according to a first preferred embodiment of the present invention. FIG. 2 is a perspective view illustrating an outer appearance of a primary conductor included in the current sensor in the first preferred embodiment of the present invention. FIG. 3 is an exploded perspective view illustrating the configuration of a magnetic sensor unit included in the current sensor in the first preferred embodiment of the present invention. FIG. 4 is a perspective view when a substrate of the magnetic sensor unit included in the current sensor in the first preferred embodiment of the present invention is viewed from an IV direction in FIG. 3. FIG. 5 is a perspective view illustrating an outer appearance of a housing of the magnetic sensor unit included in the current sensor in the first preferred embodiment of the present invention. FIG. 6 is a cross-sectional view of the current sensor in the first preferred embodiment of the present invention when the current sensor is viewed along a direction of an arrow VI-VI in FIG. 1. In illustration of FIGS. 1, 2, and 6, the width direction of a primary conductor 110, which will be described later, is an X-axis direction, the lengthwise direction of the primary conductor 110 is a Y-axis direction, and the thickness direction of the primary conductor 110 is a Z-axis direction. In FIG. 6, a center line passing through the center of a first magnetic sensor 120a, which will be described later, is indicated as C1 and a center line passing through the center of a second magnetic sensor 120b, which will be described later, is indicated as C2 in the thickness direction (Z-axis direction) of the primary conductor 110.

As illustrated in FIGS. 1 to 6, a current sensor 100 in the first preferred embodiment of the present invention includes the primary conductor 110 that is a conductor through which an electric current as a measurement target flows, the first magnetic sensor 120a and the second magnetic sensor 120b that detect intensities of magnetic fields generated by the current as the measurement target, which flows through the primary conductor 110, and a substrate 130 on which the first magnetic sensor 120a and the second magnetic sensor 120b are mounted. The primary conductor 110 includes a front surface and a rear surface and includes the lengthwise direction (Y-axis direction), the width direction (X-axis direction) orthogonal or substantially orthogonal to the lengthwise direction (Y-axis direction), and the thickness direction (Z-axis direction) orthogonal or substantially orthogonal to the lengthwise direction (Y-axis direction) and the width direction (X-axis direction). The primary conductor 110 preferably has a plate shape, for example.

The primary conductor 110 is provided such that the current as the measurement target flows in the lengthwise direction (Y-axis direction) of the primary conductor 110 as indicated by an arrow 1 while being branched into two flow paths. The primary conductor 110 includes a first flow path portion and a second flow path portion through which the current as the measurement target flows in the branched manner at a halfway position in the lengthwise direction (Y-axis direction).

The primary conductor 110 includes an arched portion 111 as the first flow path portion that is bent so as to project to one side in the thickness direction (Z-axis direction) of the primary conductor 110 and extends in the lengthwise direction (Y-axis direction) to define one flow path of the two flow paths. That is, the first flow path portion projects towards the front surface side of the primary conductor 110 when viewed from the width direction (X-axis direction). A slit 115 extending in the lengthwise direction (Y-axis direction) of the primary conductor 110 is provided in the primary conductor 110. The slit 115 is adjacent to the arched portion 111 in the width direction (X-axis direction) of the primary conductor 110. The slit 115 causes the other flow path of the two flow paths and the arched portion 111 to be located with a space therebetween in the width direction (X-axis direction) of the primary conductor 110 when the other flow path of the two flow paths and the arched portion 111 are viewed from the thickness direction (Z-axis direction) of the primary conductor 110. That is, the width of the space in the width direction (X-axis direction) of the primary conductor 110 is the width of a space in the slit 115.

The primary conductor 110 further includes an inverted arched portion 116 as the second flow path portion that is adjacent to the slit 115 at the opposite side to the arched portion 111, is bent so as to project to the other side in the thickness direction (Z-axis direction) of the primary conductor 110, and extends in the lengthwise direction (Y-axis direction) of the primary conductor 110 to define the other flow path. That is, the second flow path portion projects towards the rear surface side of the primary conductor 110 when viewed from the width direction (X-axis direction). The inverted arched portion 116 is aligned with the arched portion 111 in the width direction (X-axis direction) of the primary conductor 110. The slit 115 is located so as to be interposed between the arched portion 111 and the inverted arched portion 116. That is to say, the slit 115 is provided between the arched portion 111 and the inverted arched portion 116. The slit 115 is located at the center of the primary conductor 110 in the width direction (X-axis direction) of the primary conductor 110. A cavity 110h is provided in an inner side portion of the arched portion 111 and the inverted arched portion 116. That is, the cavity 110h defined by region surrounded by the first flow path portion and the second flow path portion is provided when viewed from the width direction (X-axis direction).

As illustrated in FIG. 2, in the present preferred embodiment, the arched portion 111 includes a first projecting portion 112 and a second projecting portion 113 projecting so as to be orthogonal or substantially orthogonal to the main surface of the primary conductor 110 with a space therebetween and an extending portion 114 extending in the lengthwise direction (Y-axis direction) of the primary conductor 110 and connecting the first projecting portion 112 and the second projecting portion 113. The inverted arched portion 116 includes a third projecting portion 117 and a fourth projecting portion 118 projecting so as to be orthogonal or substantially orthogonal to the main surface of the primary conductor 110 with a space therebetween and an extending portion 119 extending in the lengthwise direction (Y-axis direction) of the primary conductor 110 and connecting the third projecting portion 117 and the fourth projecting portion 118.

It should be noted that the respective shapes of the arched portion 111 and the inverted arched portion 116 are not limited thereto. For example, they may be C shapes or semicircular shapes when viewed from the width direction (X-axis direction) of the primary conductor 110. The arched portion 111 and the inverted arched portion 116 preferably have the same or substantially the same shape. That is to say, the first flow path portion and the second flow path portion preferably have shapes that are point-symmetrical to each other. It should be noted that a flat portion that is continuous across the main surface of the primary conductor 110 may be provided, instead of the inverted arched portion 116 in the primary conductor 110. Although the primary conductor 110 is defined by one conductor in the present preferred embodiment, it may be defined by a plurality of conductors.

The primary conductor 110 is preferably made of, for example, copper having low electric resistance and excellent workability in the present preferred embodiment. To be more specific, the primary conductor 110 is preferably made of, for example, oxygen-free copper having excellent heat resistance. A material of the primary conductor 110 is, however, not limited thereto and may be a metal such as silver, aluminum, and iron, or alloy including any of these metals, for example.

The primary conductor 110 may be subjected to surface processing. For example, at least a single plating layer, which is made of a metal such as nickel, tin, silver, and copper or alloy including any of these metals, may preferably be provided on the surface of the primary conductor 110.

In the present preferred embodiment, the primary conductor 110 is preferably formed by press processing, for example. It should be noted that a formation method of the primary conductor 110 is not limited thereto and the primary conductor 110 may be formed by cutting processing, casting, or other suitable method.

As illustrated in FIG. 3, each of the first magnetic sensor 120a and the second magnetic sensor 120b is mounted on the substrate 130 together with a plurality of electronic components 140a and 140b, such as amplifiers and passive elements, for example. At least either the plurality of electronic components 140a or the plurality of electronic components 140b include an electronic component functioning as a calculator, which will be described later. It should be noted that the first magnetic sensor 120a and the second magnetic sensor 120b may be mounted on different substrates. In other words, the current sensor 100 may include a plurality of substrates.

In the present preferred embodiment, the first magnetic sensor 120a is mounted on one main surface of the substrate 130. The second magnetic sensor 120b is mounted on the other main surface of the substrate 130. The first magnetic sensor 120a and the second magnetic sensor 120b overlap with each other when viewed from the thickness direction (Z-axis direction) of the primary conductor 110. Preferably, the center of the first magnetic sensor 120a and the center of the second magnetic sensor 120b overlap with each other when viewed from the thickness direction (Z-axis direction) of the primary conductor 110. That is, a center line C1 and a center line C2 are preferably located on the same or substantially the same straight line.

The plurality of electronic components 140a are mounted on the one main surface of the substrate 130. The plurality of electronic components 140a are located at one side in the width direction (X-axis direction) of the primary conductor 110 when viewed from the first magnetic sensor 120a. The plurality of electronic components 140b are mounted on the other main surface of the substrate 130. The plurality of electronic components 140b are located at the other side in the width direction (X-axis direction) of the primary conductor 110 when viewed from the second magnetic sensor 120b.

The substrate 130 is fixed in a housing 150 having an electric insulation property to define a magnetic sensor unit 160. That is, each of the first magnetic sensor 120a, the second magnetic sensor 120b, the electronic components 140a and 140b, and the substrate 130 is provided in the housing 150.

The substrate 130 is a printed wiring board, and preferably includes, for example, a base body made of glass epoxy and alumina and wirings formed by patterning metal foil of copper or other suitable metal, which are provided on the surface of the base body.

The housing 150 preferably has a rectangular or substantially rectangular parallelepiped outer shape and includes a lower housing 151 and an upper housing 152. A fitting portion 151c which is fitted with the inverted arched portion 116 in a state of contacting the front surface of the extending portion 119 of the inverted arched portion 116 is provided in the lower housing 151. A fitting portion 152c which is fitted with the arched portion 111 in a state of contacting the rear surface of the extending portion 114 of the arched portion 111 and a takeout portion 152p of a wire harness, which is connected to the substrate 130, are provided in the upper housing 152.

The housing 150 is preferably made of engineering plastic, such as PPS (polyphenylene sulfide), polybutylene terephthalate resin (PBT), liquid crystal polymer (LCP), urethane, and nylon, for example. The PPS has high heat resistance and is therefore preferable as a material of the housing 150 in consideration of heat generation of the primary conductor 110.

As a method for fixing the substrate 130 to the housing 150, fastening with screws, heat welding with resin, bonding with an adhesive, or other suitable methods may be used. When the substrate 130 and the housing 150 are fastened with each other using the screws, non-magnetic screws are preferably used so as not to disturb the magnetic fields.

The magnetic sensor unit 160 is inserted into the cavity 110h defined by the arched portion 111 and the inverted arched portion 116. When the center of the housing 150 and the center of the cavity 110h are identical or substantially identical to each other by inserting, in an oblique direction, the magnetic sensor unit 160 into the cavity 110h with the fitting portion 152c side at the head in a state in which the magnetic sensor unit 160 is obliquely inclined with respect to the main surface of the primary conductor 110, the magnetic sensor unit 160 is rotated about the center of the housing 150 as a rotation center.

As a result, the fitting portion 152c of the upper housing 152 is fitted with the arched portion 111 in contact with the rear surface of the extending portion 114 of the arched portion 111 and the fitting portion 151c of the lower housing 151 is fitted with the inverted arched portion 116 in contact with the front surface of the extending portion 119 of the inverted arched portion 116. That is, the housing 150 is assembled on the primary conductor 110 so as to be fitted into the inner side portion of the arched portion 111. The housing 150 is assembled on the primary conductor 110 so as to be fitted into the inner side portion of the inverted arched portion 116. In this manner, the magnetic sensor unit 160 is assembled on the primary conductor 110.

In the present preferred embodiment, the wall surface of the upper housing 152, which is perpendicular or substantially perpendicular to the upper surface of the fitting portion 152c, contacts the extending portion 114 of the arched portion 111. This contact causes the magnetic sensor unit 160 to be positioned with respect to the primary conductor 110 in the width direction (X-axis direction) of the primary conductor 110.

The one main surface of the substrate 130 opposes the rear surface of the extending portion 114 of the arched portion 111 in the inner side portion of the arched portion 111 in the state in which the magnetic sensor unit 160 is assembled on the primary conductor 110. The other main surface of the substrate 130 opposes the front surface of the extending portion 119 of the inverted arched portion 116. That is, the substrate 130 is located in the above-described region and opposes both of the first flow path portion and the second flow path portion when viewed from the width direction (X-axis direction) of the primary conductor 110. The arrangement of the substrate 130 is, however, not limited to the above-described arrangement and it is sufficient that at least a portion of the substrate 130 is located in the above-described region and opposes at least one of the first flow path portion and the second flow path portion when viewed from the width direction (X-axis direction) of the primary conductor 110.

The first magnetic sensor 120a and the second magnetic sensor 120b are arranged in the space between the arched portion 111 and the inverted arched portion 116 in the width direction (X-axis direction) of the primary conductor 110. In the present preferred embodiment, a space L1 between the first magnetic sensor 120a and the extending portion 114 of the arched portion 111 and a space L2 between the second magnetic sensor 120b and the extending portion 119 of the inverted arched portion 116 are preferably equal or substantially equal to each other in the width direction (X-axis direction) of the primary conductor 110. It should be noted that the space L1 and the space L2 may be different from each other.

The first magnetic sensor 120a overlaps with at least a portion of the extending portion 114 of the arched portion 111 when viewed from the width direction (X-axis direction) of the primary conductor 110. The second magnetic sensor 120b overlaps with at least a portion of the extending portion 119 of the inverted arched portion 116 when viewed from the width direction (X-axis direction) of the primary conductor 110.

Each of the plurality of electronic components 140a preferably overlaps with the extending portion 119 of the inverted arched portion 116 in the thickness direction (Z-axis direction) of the primary conductor 110. Each of the plurality of electronic components 140b preferably overlaps with the extending portion 114 of the arched portion 111 in the thickness direction (Z-axis direction) of the primary conductor 110.

Figure 7:
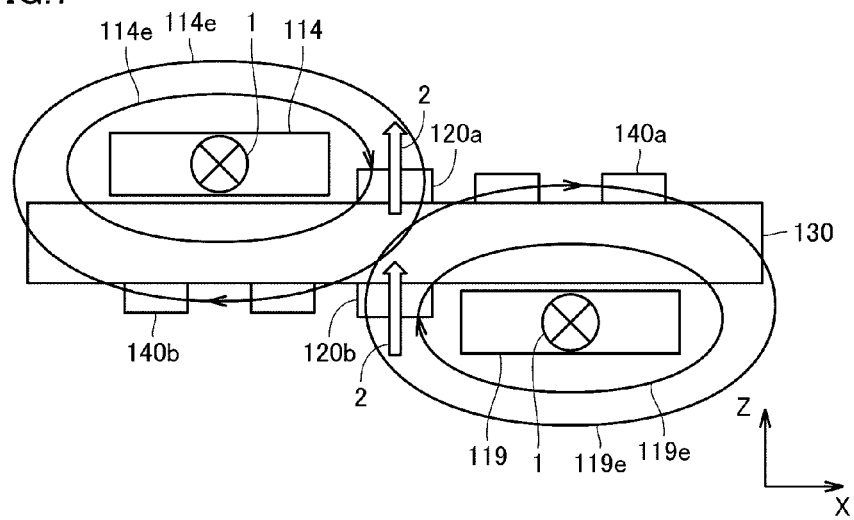
FIG. 7 is a cross-sectional view schematically illustrating magnetic fields generated by flow of a current as a measurement target in the current sensor in the first preferred embodiment of the present invention.
Figure 8:
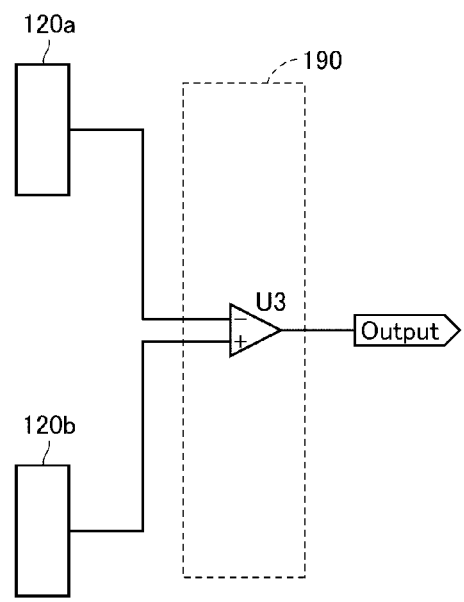
FIG. 8 is a circuit diagram illustrating the circuit configuration of the current sensor in the first preferred embodiment of the present invention.

FIG. 7 is a cross-sectional view schematically illustrating magnetic fields generated by flow of the current as the measurement target in the current sensor in the first preferred embodiment of the present invention. FIG. 8 is a circuit diagram illustrating the circuit configuration of the current sensor in the first preferred embodiment of the present invention. In FIG. 7, the width direction of the primary conductor 110 is the X-axis direction, the lengthwise direction of the primary conductor 110 is the Y-axis direction, and the thickness direction of the primary conductor 110 is the Z-axis direction. FIG. 7 does not illustrate the housing 150. FIG. 7 is a cross-sectional view similar to FIG. 6.

As illustrated in FIG. 7, each of the first magnetic sensor 120a and the second magnetic sensor 120b detects the magnetic fields in the thickness direction (Z-axis direction) of the primary conductor 110. Specifically, each of the first magnetic sensor 120a and the second magnetic sensor 120b includes a detection axis 2 directed in the thickness direction (Z-axis direction) of the primary conductor 110.

Each of the first magnetic sensor 120a and the second magnetic sensor 120b has odd function input/output characteristics of outputting a positive value when detecting a magnetic field directed in one direction of the detection axis 2 and outputting a negative value when detecting a magnetic field directed in the opposite direction to the one direction of the detection axis 2.

As illustrated in FIG. 8, in the current sensor 100 in the present preferred embodiment, each of the first magnetic sensor 120a and the second magnetic sensor 120b preferably includes a Hall element. Although as a material of the Hall element, Si is preferably used in the present preferred embodiment, GaAs, InAs, InSb, or other suitable material may be used.

It should be noted that each of the first magnetic sensor 120a and the second magnetic sensor 120b may include a magnetoresistive element, for example, instead of the Hall element. The magnetic element, such as the Hall element and the magnetoresistive element, may be packaged with resin or may be potted with silicone resin or epoxy resin, for example.

When a plurality of magnetic elements are packaged, the plurality of magnetic elements may be packaged together, or each of the plurality of magnetic elements may be separately packaged. Furthermore, the plurality of magnetic elements and the electronic components may be packaged together in an integrated state.

As illustrated in FIG. 8, the current sensor 100 further includes a calculator 190 that calculates a value of the current as the measurement target flowing through the primary conductor 110 using the detection value of the first magnetic sensor 120a and the detection value of the second magnetic sensor 120b. In the present preferred embodiment, the calculator 190 is preferably a differential amplifier. It should be noted that the calculator 190 may be a subtractor, for example.

As illustrated in FIG. 7, the current as the measurement target flowing through the primary conductor 110 flows while being branched into the two flow paths of the first flow path portion passing through the arched portion 111 and the second flow path portion passing through the inverted arched portion 116. Flow of the current while being branched into the two flow paths in the primary conductor 110 generates the magnetic fields revolving around the respective flow paths by Maxwell's corkscrew rule.

As illustrated in FIG. 7, the first magnetic sensor 120a is mounted on the one main surface of the substrate 130, which opposes the rear surface of the extending portion 114 of the arched portion 111 in the inner side portion of the arched portion 111, and is arranged in the space between the arched portion 111 and the inverted arched portion 116 in the width direction (X-axis direction) of the primary conductor 110. Therefore, magnetic fields 114e revolving around the extending portion 114 are applied to the first magnetic sensor 120a.

The second magnetic sensor 120b is mounted on the other main surface of the substrate 130, which opposes the front surface of the extending portion 119 of the inverted arched portion 116, and is arranged in the space between the arched portion 111 and the inverted arched portion 116 in the width direction (X-axis direction) of the primary conductor 110. Therefore, magnetic fields 119e revolving around the extending portion 119 are applied to the second magnetic sensor 120b.

As illustrated in FIG. 7, orientations of magnetic fluxes in the Z-axis direction at a position at one side surface side (right side surface side) of the extending portion 114 and a position at the other side surface side (left side surface side) of the extending portion 119 are opposite to each other. That is, the orientation of the magnetic flux acting on the first magnetic sensor 120a and the orientation of the magnetic flux acting on the second magnetic sensor 120b are opposite to each other. Therefore, a phase of the detection value of the first magnetic sensor 120a and a phase of the detection value of the second magnetic sensor 120b are opposite to each other for the intensity of the magnetic field generated by the current as the measurement target flowing through the primary conductor 110. When the intensity of the magnetic field detected by the first magnetic sensor 120a is assumed to be a positive value, the intensity of the magnetic field detected by the second magnetic sensor 120b is a negative value.

The calculator 190 uses the detection value of the first magnetic sensor 120a and the detection value of the second magnetic sensor 120b for calculation. Specifically, the calculator 190 subtracts the detection value of the second magnetic sensor 120b from the detection value of the first magnetic sensor 120a. As a result, the value of the current as the measurement target flowing through the primary conductor 110 is calculated.

In the current sensor 100 in the present preferred embodiment, the magnetic sensor unit 160 is inserted into the cavity 110h and an external magnetic field source cannot, therefore, be physically located between the first magnetic sensor 120a and the second magnetic sensor 120b.

Therefore, an orientation of a magnetic field component in the direction of the detection axis in a magnetic field applied to the first magnetic sensor 120a from the external magnetic field source and an orientation of a magnetic field component in the direction of the detection axis in a magnetic field applied to the second magnetic sensor 120b from the external magnetic field source are the same or substantially the same as each other. In other words, when an intensity of the external magnetic field detected by the first magnetic sensor 120a is assumed to be a positive value, an intensity of the external magnetic field detected by the second magnetic sensor 120b is also a positive value.

As a result, when the calculator 190 subtracts the detection value of the second magnetic sensor 120b from the detection value of the first magnetic sensor 120a, almost no magnetic field from the external magnetic field source is detected. That is, influences due to the external magnetic field are reduced.

As a first modification on the present preferred embodiment, the directions of the detection axes in which the detection values are positive values may be opposite (by 180°) to each other between the first magnetic sensor 120a and the second magnetic sensor 120b. In this case, when the intensity of the external magnetic field detected by the first magnetic sensor 120a is assumed to be a positive value, the intensity of the external magnetic field detected by the second magnetic sensor 120b is a negative value.

On the other hand, the phase of the detection value of the first magnetic sensor 120a and the phase of the detection value of the second magnetic sensor 120b are the same or substantially the same as each other for the intensity of the magnetic field generated by the current as the measurement target flowing through the primary conductor 110.

In the first modification on the present preferred embodiment, an adder or a summing amplifier is preferably used as the calculator 190, instead of the differential amplifier. For the intensity of the external magnetic field, the detection value of the first magnetic sensor 120a and the detection value of the second magnetic sensor 120b are added to each other by the adder or the summing amplifier, so that an absolute value of the detection value of the first magnetic sensor 120a and an absolute value of the detection value of the second magnetic sensor 120b are subtracted from each other. With this operation, almost no magnetic field from the external magnetic field source is detected. That is, influences by the external magnetic field are reduced.

On the other hand, for the intensity of the magnetic fields generated by the current flowing through the primary conductor 110, the detection value of the first magnetic sensor 120a and the detection value of the second magnetic sensor 120b are added to each other by the adder or the summing amplifier, so that the value of the current as the measurement target flowing through the primary conductor 110 is calculated.

In this manner, the adder or the summing amplifier may be used as the calculator, instead of the differential amplifier, while the input/output characteristics of the first magnetic sensor 120a and the second magnetic sensor 120b are set to polarities that are inverse to each other.

The current sensor 100 in the present preferred embodiment is able to reduce the influences by the external magnetic field. The current sensor 100 in the present preferred embodiment is able to produce a heat generation amount of the arched portion 111 and a heat generation amount of the inverted arched portion 116, due to flow of the measurement current through the primary conductor 110, that are equivalent to each other because an electric resistance value of the arched portion 111 and an electric resistance value of the inverted arched portion 116 are the same or substantially the same. As a result, a temperature around the magnetic element of the first magnetic sensor 120a and a temperature around the magnetic element of the second magnetic sensor 120b are the same or substantially the same, thus reducing an error in the measurement value of the current sensor 100 due to temperature characteristics of the magnetic elements.

The current sensor 100 in the present preferred embodiment is structured such that the housing 150 accommodating the substrate 130 on which the first magnetic sensor 120a and the second magnetic sensor 120b are mounted is assembled on the primary conductor 110 defined by one conductor. Therefore, assembly of the current sensor 100 is facilitated and the number of components are reduced to achieve cost reduction as compared to the case in which the primary conductor defined by a plurality of conductors is used.

In the current sensor 100 in the present preferred embodiment, the substrate 130 is preferably arranged such that the mounting surface of the substrate 130 and the main surface of the primary conductor 110 are in parallel or substantially in parallel with each other, thus reducing the height of the current sensor 100.

In the current sensor 100 in the present preferred embodiment, the fitting portion 152c of the upper housing 152 is fitted with the arched portion 111 so as to be in contact with the rear surface of the extending portion 114 of the arched portion 111 and the fitting portion 151c of the lower housing 151 is fitted with the inverted arched portion 116 so as to be in contact with the front surface of the extending portion 119 of the inverted arched portion 116, such that the magnetic sensor unit 160 is assembled on the primary conductor 110. Furthermore, the wall surface of the upper housing 152, which is perpendicular or substantially perpendicular to the upper surface of the fitting portion 152c, contacts the extending portion 114 of the arched portion 111. This contact enables the magnetic sensor unit 160 to be positioned with respect to the primary conductor 110 in the width direction (X-axis direction) of the primary conductor 110.

With this configuration, variations in the position of the first magnetic sensor 120a with respect to the arched portion 111 and variations in the position of the second magnetic sensor 120b with respect to the inverted arched portion 116 are respectively reduced, thus reducing variations in measurement accuracy of the current sensor 100. As a result, measurement reproducibility and mass-productivity of the current sensor 100 are improved. Furthermore, the arched portion 111 and the inverted arched portion 116 protect the components of the magnetic sensor unit 160 from external force.

Effects of the current sensor 100 in the present preferred embodiment in the case in which the current as the measurement target flowing through the primary conductor 110 is an alternating current having a high frequency will be described. Although the first flow path portion of the two flow paths is described in the following description, the same holds true for the second flow path portion.

Figure 9:
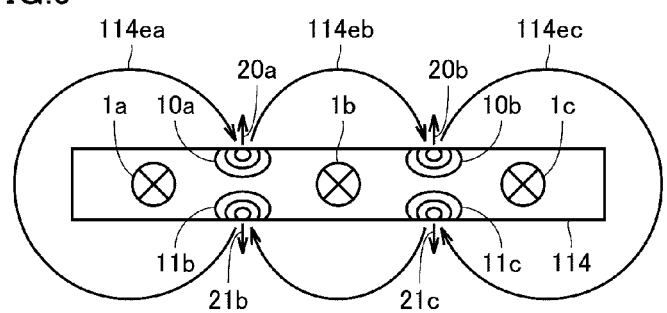
FIG. 9 is a cross-sectional view schematically illustrating magnetic fields generated when the current as the measurement target starts flowing through an arched portion of the primary conductor of the current sensor in the first preferred embodiment of the present invention.
Figure 10:
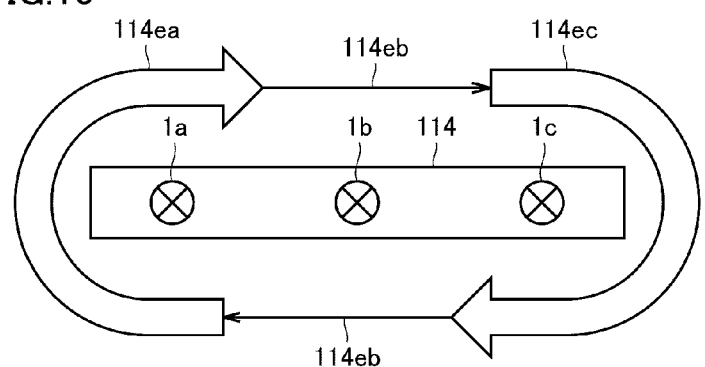
FIG. 10 is a cross-sectional view schematically illustrating magnetic fields revolving around the arched portion when the current as the measurement target starts flowing through the arched portion of the primary conductor of the current sensor in the first preferred embodiment of the present invention.

FIG. 9 is a cross-sectional view schematically illustrating magnetic fields generated when the current as the measurement target starts flowing through the arched portion of the primary conductor of the current sensor in the first preferred embodiment of the present invention. FIG. 10 is a cross-sectional view schematically illustrating magnetic fields revolving around the arched portion when the current as the measurement target starts flowing through the arched portion of the primary conductor of the current sensor in the first preferred embodiment of the present invention. In FIGS. 9 and 10, in terms of the current as the measurement target flowing through the arched portion of the primary conductor, a current flowing through one end portion is indicated by 1a, a current flowing through a center portion is indicated by 1b, and a current flowing through the other end portion is indicated by 1c in the width direction (X-axis direction) of the primary conductor.

As illustrated in FIG. 9, in the arched portion 111 of the primary conductor 110 of the current sensor 100 in the present preferred embodiment, a magnetic field 114ea, a magnetic field 114eb, and a magnetic field 114ec are generated by flow of the current 1a, the current 1b, and the current 1c, respectively. Eddy currents 10a, 10b, 11b, and 11c are generated in the primary conductor 110 by an electro-magnetic induction effect produced by the generation of the magnetic field 114ea, the magnetic field 114eb, and the magnetic field 114ec.

Specifically, the eddy current 10a is generated at a position at which the magnetic field 114ea enters the front surface of the primary conductor 110 and a magnetic field 20a canceling the magnetic field 114ea is generated. The eddy current 10b is generated at a position at which the magnetic field 114eb enters the front surface of the primary conductor 110 and a magnetic field 20b canceling the magnetic field 114eb is generated. The eddy current 11c is generated at a position at which the magnetic field 114ec enters the rear surface of the primary conductor 110 and a magnetic field 21c canceling the magnetic field 114ec is generated. The eddy current 11b is generated at a position at which the magnetic field 114eb enters the rear surface of the primary conductor 110 and a magnetic field 21b canceling the magnetic field 114eb is generated.

Therefore, in the case in which the current as the measurement target flowing through the primary conductor 110 is an alternating current having a high frequency, as illustrated in FIG. 10, a magnetic flux density of the magnetic field 114eb is lower than a magnetic flux density of each of the magnetic field 114ea and the magnetic field 114ec when the current as the measurement target starts flowing through the arched portion 111 of the primary conductor 110. If the first magnetic sensor 120a is arranged at a position at which the magnetic field 114eb acts thereon, the output of the first magnetic sensor 120a is decreased when the current as the measurement target starts flowing through the arched portion 111 of the primary conductor 110 and the output of the first magnetic sensor 120a is increased as the magnitudes of the eddy currents 10a, 10b, 11b, and 11c are reduced with passage of time. In this case, a rising time of the output of the current sensor is increased.

The problem of the increase in the rising time of the output of the current sensor becomes significant as the value of the current as the measurement target is increased and as the frequency of the current as the measurement target is increased. A reason for this is as follows. When the value of the current as the measurement target is large (for example, equal to or larger than about 500 A and equal to or smaller than about 1000 A), the width and the thickness of the primary conductor are increased (for example, the width is increased to be equal to or larger than about 10 mm and equal to or smaller than about 20 mm and the thickness is increased to be equal to or larger than about 2 mm and equal to or smaller than about 3 mm) in order to decrease the electric resistance of the primary conductor. When the frequency of the current as the measurement target is high (for example, equal to or higher than about 100 kHz and equal to or lower than about 1000 kHz), the current as the measurement target primarily flows through the vicinity of the outer circumferential surface of the primary conductor by the skin effect. Therefore, the width and the thickness of the primary conductor are increased in order to reduce or prevent heat generation of the primary conductor. In these cases, the areas in which the eddy currents 10b and 11b are generated are increased and the magnetic field 114eb becomes difficult to pass through the primary conductor, resulting in decrease in the magnetic flux density of the magnetic field 114eb when the current as the measurement target starts flowing through the arched portion of the primary conductor. As a result, the rising time of the output of the current sensor is significantly increased.

In the current sensor 100 in the first preferred embodiment of the present invention, the first magnetic sensor 120a is arranged at the position at which the magnetic field 114ec acts thereon. Therefore, a decrease in the output of the first magnetic sensor 120a when the current as the measurement target starts flowing through the arched portion 111 of the primary conductor 110 due to the generation of the eddy currents is able to be reduced or prevented. The output of the second magnetic sensor 120b is improved in the same or substantially the same manner. As a result, the rising time of the output of the current sensor 100 is decreased to reduce the measurement error of the current sensor 100 and make the frequency characteristics of the current sensor 100 preferable. This effect of the current sensor 100 occurs more significantly as the value of the current as the measurement target is increased and as the frequency of the current as the measurement target is increased.

An experimental result of a comparison between frequency characteristics of a current sensor in a comparative example and those of the current sensor in the first preferred embodiment of the present invention will be described. The current sensor in the comparative example is different from the current sensor in the first preferred embodiment of the present invention only in that the first magnetic sensor 120a is arranged at a position at which the magnetic field 114eb acts thereon and the second magnetic sensor 120b is arranged in the same or substantially the same manner.

Figure 11:
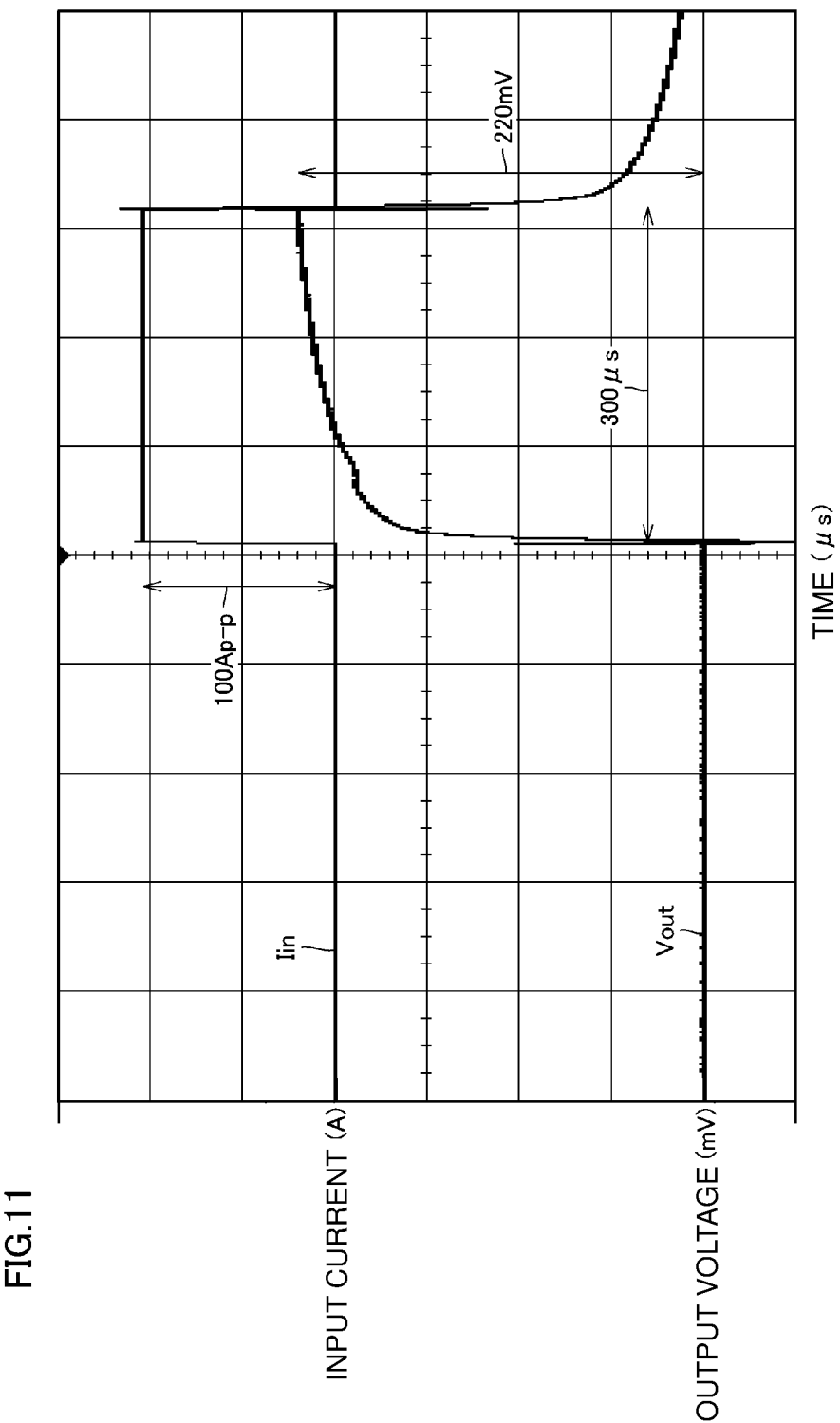
FIG. 11 is a graph illustrating a relationship between an input current and an output voltage of a current sensor according to a comparative example.
Figure 12:
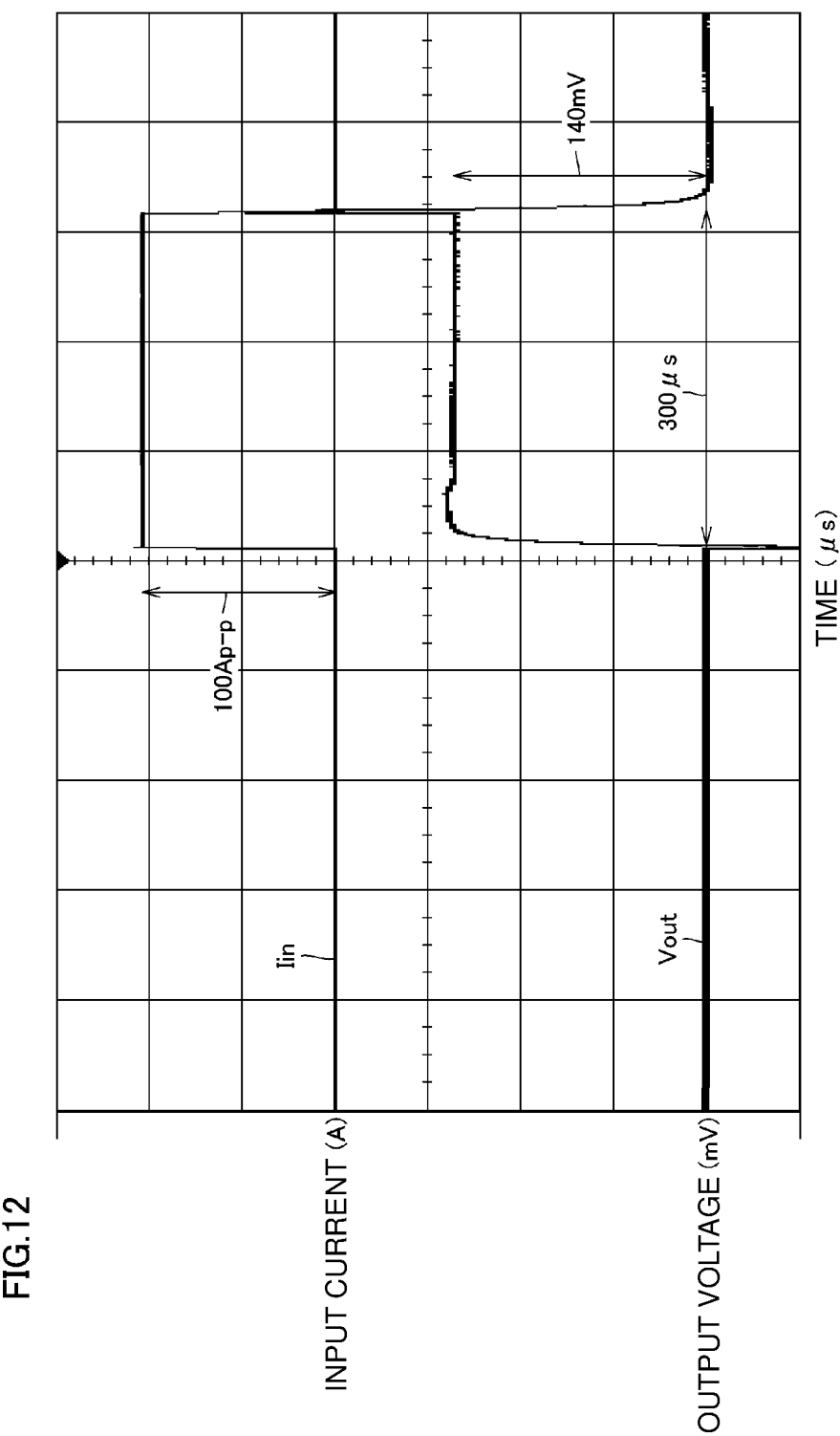
FIG. 12 is a graph illustrating a relationship between an input current and an output voltage of the current sensor in the first preferred embodiment of the present invention.

FIG. 11 is a graph illustrating a relationship between an input current and an output voltage of the current sensor in the comparative example. FIG. 12 is a graph illustrating a relationship between an input current and an output voltage of the current sensor in the first preferred embodiment of the present invention. In FIGS. 11 and 12, the vertical axis indicates the input current Iin (A) and the output voltage Vout (mV) and the horizontal axis indicates time (μs).

As illustrated in FIGS. 11 and 12, in each of the current sensor in the comparative example and the current sensor 100 in the first preferred embodiment of the present invention, the input current of about 100 A was made to flow through the primary conductor for about 300 μs. In the current sensor in the comparative example, the output voltage when the current as the measurement target started flowing through the arched portion of the primary conductor was about 190 mV, a peak value of the output voltage was about 220 mV, and a time to reach the peak value of the output voltage was about 280 μs.

In the current sensor 100 in the first preferred embodiment of the present invention, the output voltage when the current as the measurement target started flowing through the arched portion 111 of the primary conductor 110 was about 140 mV, a peak value of the output voltage was about 140 mV, and a time to reach the peak value of the output voltage was about 10 μs, for example.

From the above-described results of the experiment, it was discovered that in the current sensor 100 in the first preferred embodiment of the present invention, the peak value of the output voltage was reduced and sensitivity was slightly reduced, however the rising time of the output of the current sensor could be decreased as compared to the current sensor in the comparative example.

That is, the current sensor 100 in the first preferred embodiment of the present invention is able to be reduced in height, reduce the influences by the external magnetic field, and produce frequency characteristics of the current sensor 100 that are preferable.

Furthermore, in the current sensor 100 in the first preferred embodiment of the present invention, each of the plurality of electronic components 140a overlaps with the extending portion 119 of the inverted arched portion 116 in the thickness direction (Z-axis direction) of the primary conductor 110 and each of the plurality of electronic components 140b overlaps with the extending portion 114 of the arched portion 111 in the thickness direction (Z-axis direction) of the primary conductor 110. Therefore, high measurement accuracy of the current sensor 100 is maintained. A reason for this will be described below.

Figure 13:
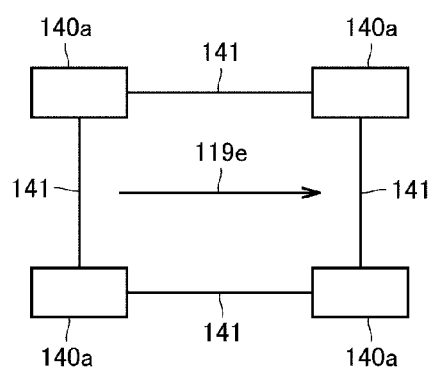
FIG. 13 is a plan view illustrating a state in which a plurality of electronic components mounted on the substrate are connected to one another with wirings to construct a circuit in the current sensor in the first preferred embodiment of the present invention.

FIG. 13 is a plan view illustrating a state in which the plurality of electronic components mounted on the substrate are connected to each other with wirings to define a circuit in the current sensor in the first preferred embodiment of the present invention. As illustrated in FIG. 13, when the plurality of electronic components 140a are connected to each other with wirings 141 to define the circuit, the wirings 141 define a loop in some cases. If a magnetic field is applied so as to pass through the loop, induced electromotive force is generated and output of the current sensor includes noise, resulting in lower measurement accuracy of the current sensor.

In the current sensor 100 in the present preferred embodiment, each of the plurality of electronic components 140a is arranged so as to overlap with the extending portion 119 of the inverted arched portion 116 in the thickness direction (Z-axis direction) of the primary conductor 110. Therefore, as illustrated in FIG. 13, a magnetic field 119e generated around the extending portion 119 travels in the direction orthogonal or substantially orthogonal to the center axis of the loop defined by the wirings 141 and does not pass through the loop. The same holds true for the plurality of electronic components 140b. Accordingly, high measurement accuracy of the current sensor 100 is maintained while reducing or preventing the output of the current sensor 100 from including noise.

Although the first magnetic sensor 120a and the second magnetic sensor 120b preferably overlap with each other when viewed from the thickness direction (Z-axis direction) of the primary conductor 110 in the current sensor 100 in the present preferred embodiment, they may deviate from each other.

Figure 14:
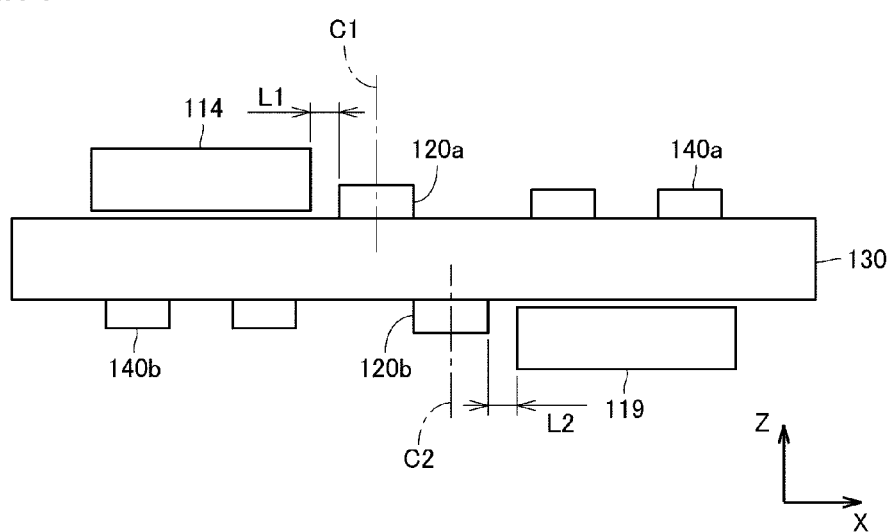
FIG. 14 is a cross-sectional view of a current sensor according to a second modification of the first preferred embodiment of the present invention.

FIG. 14 is a cross-sectional view of a current sensor according to a second modification of the first preferred embodiment of the present invention. FIG. 14 does not illustrate the housing 150. FIG. 14 is a cross-sectional view similar to FIG. 7.

As illustrated in FIG. 14, in the current sensor in the second modification of the first preferred embodiment of the present invention, the center of the first magnetic sensor 120a and the center of the second magnetic sensor 120b deviate from each other in the width direction (X-axis direction) of the primary conductor 110. The first magnetic sensor 120a and the second magnetic sensor 120b do not overlap with each other when viewed from the thickness direction (Z-axis direction) of the primary conductor 110. The space L1 between the first magnetic sensor 120a and the extending portion 114 of the arched portion 111 and the space L2 between the second magnetic sensor 120b and the extending portion 119 of the inverted arched portion 116 are preferably equal or substantially equal to each other in the width direction (X-axis direction) of the primary conductor 110.

The current sensor in the second modification of the first preferred embodiment of the present invention is also able to be reduced in height, reduce influences by the external magnetic field, and produce frequency characteristics of the current sensor that are preferable.

Figure 15:
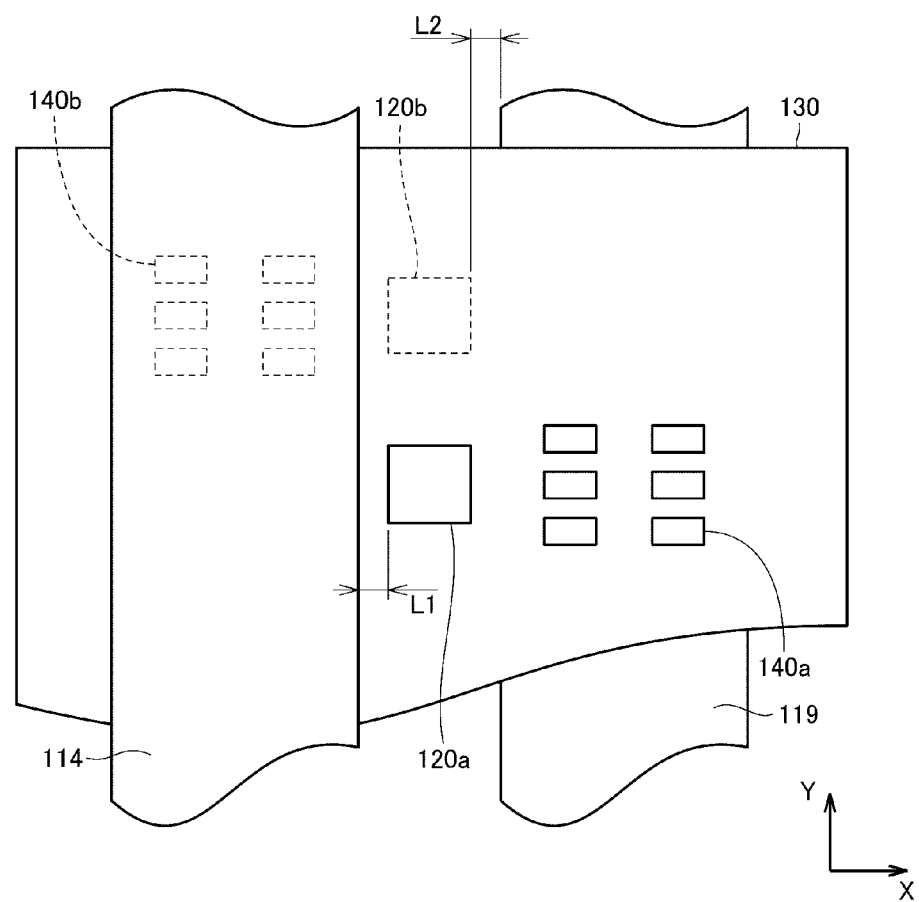
FIG. 15 is a plan view of a current sensor according to a third modification of the first preferred embodiment of the present invention.

FIG. 15 is a plan view of a current sensor according to a third modification of the first preferred embodiment of the present invention. FIG. 15 does not illustrate the housing 150. As illustrated in FIG. 15, in the current sensor in the third modification of the first preferred embodiment of the present invention, the center of the first magnetic sensor 120a and the center of the second magnetic sensor 120b deviate from each other in the lengthwise direction (Y-axis direction) of the primary conductor 110. The first magnetic sensor 120a and the second magnetic sensor 120b do not overlap with each other when viewed from the thickness direction (Z-axis direction) of the primary conductor 110. The space L1 between the first magnetic sensor 120a and the extending portion 114 of the arched portion 111 and the space L2 between the second magnetic sensor 120b and the extending portion 119 of the inverted arched portion 116 are preferably equal or substantially equal to each other in the width direction (X-axis direction) of the primary conductor 110.

The current sensor in the third modification of the first preferred embodiment of the present invention is also able to be reduced in height, reduce influences by the external magnetic field, and make frequency characteristics of the current sensor preferable.

As described for the current sensor in the third modification of the first preferred embodiment of the present invention, the current sensor 100 in the first preferred embodiment of the present invention has a high degree of freedom of the arrangement of each of the first magnetic sensor 120a and the second magnetic sensor 120b. Therefore, high positional accuracy of the first magnetic sensor 120a and the second magnetic sensor 120b is not required, thus facilitating manufacturing the current sensor 100.

Figure 16:
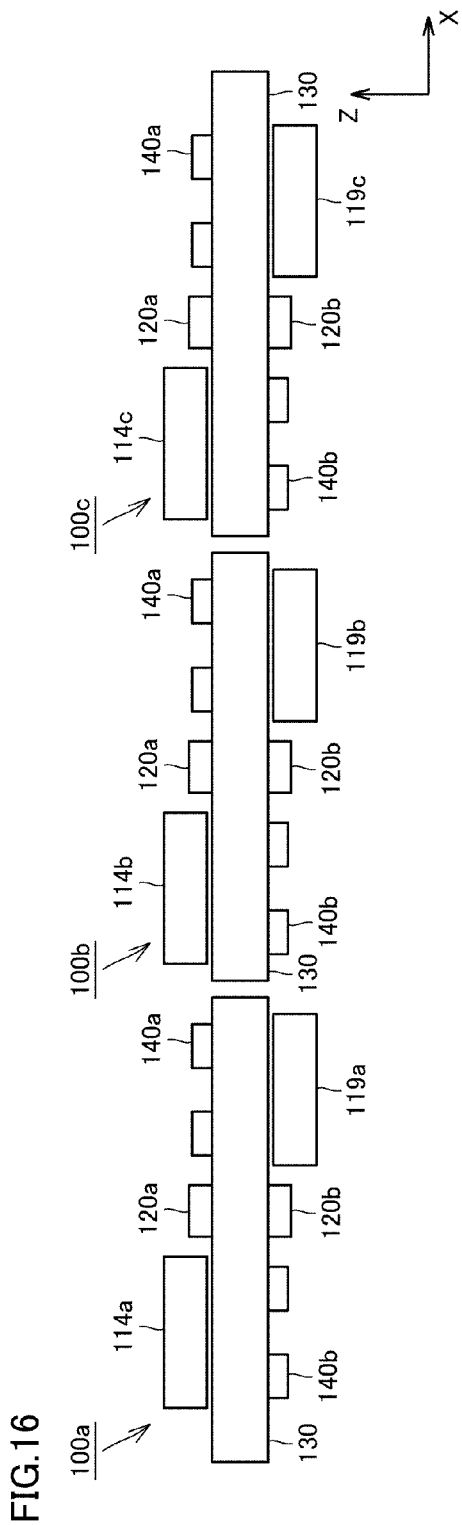
FIG. 16 is a cross-sectional view illustrating a state in which the current sensor in the first preferred embodiment of the present invention is applied to three-phase three-wire system wiring.

The current sensor 100 in the present preferred embodiment may be applied to three-phase three-wire system wiring of an inverter or other suitable devices. FIG. 16 is a cross-sectional view illustrating a state in which the current sensor in the first preferred embodiment of the present invention is applied to the three-phase three-wire system wiring. FIG. 16 does not illustrate the housing 150. FIG. 16 is a cross-sectional view similar to FIG. 7.

As illustrated in FIG. 16, three current sensors 100a, 100b, and 100c may be arranged so as to be aligned in the width direction (X-axis direction) of the primary conductor 110, a current of a first phase may be input to the primary conductor 110 of the current sensor 100a, a current of a second phase may be input to the primary conductor 110 of the current sensor 100b, and a current of a third phase may be input to the primary conductor 110 of the current sensor 100c.

Second Preferred Embodiment

Hereinafter, a current sensor according to a second preferred embodiment of the present invention will be described. The current sensor in the present preferred embodiment is different from the current sensor 100 in the first preferred embodiment only in that each of the first magnetic sensor 120a and the second magnetic sensor 120b includes a magnetoresistive element, instead of the Hall element. Therefore, description of the same structure and configurations as those of the current sensor 100 in the first preferred embodiment is not repeated.

Figure 17:
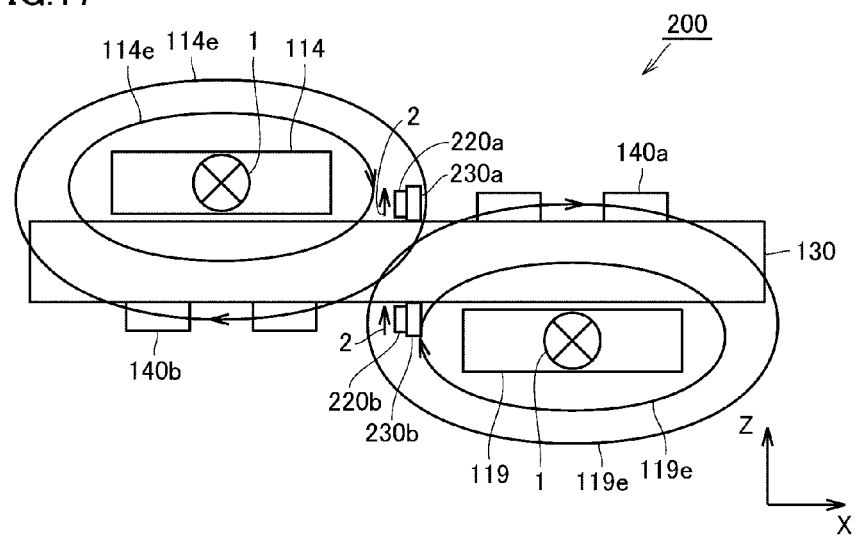
FIG. 17 is a cross-sectional view schematically illustrating magnetic fields generated by flow of a current as a measurement target in a current sensor according to a second preferred embodiment of the present invention.
Figure 18:
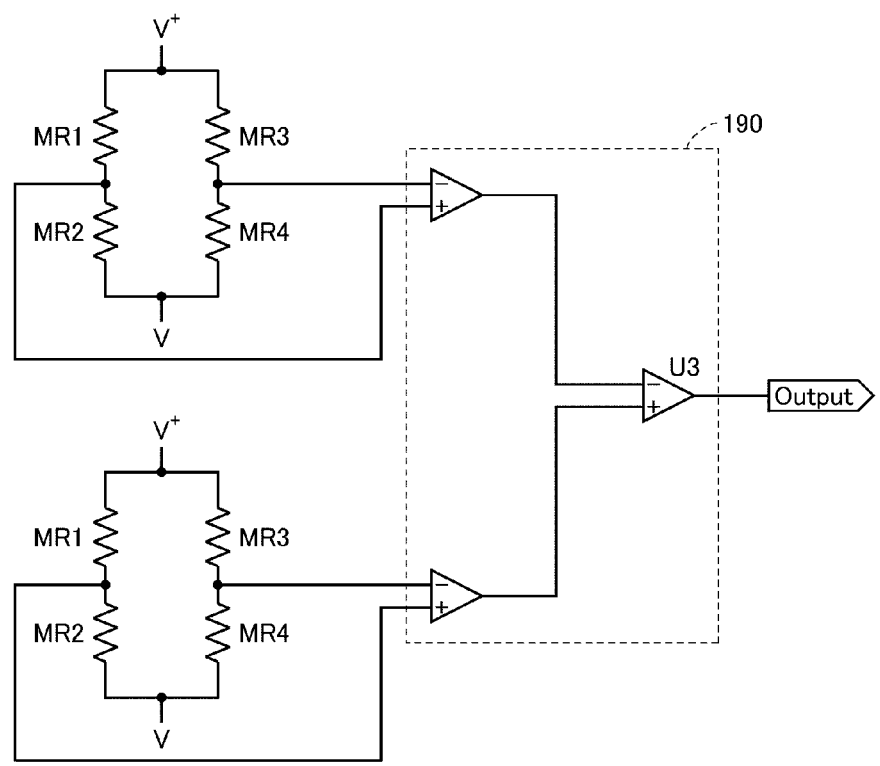
FIG. 18 is a circuit diagram illustrating the circuit configuration of the current sensor in the second preferred embodiment of the present invention.

FIG. 17 is a cross-sectional view schematically illustrating magnetic fields generated by flow of a current as a measurement target in the current sensor in the second preferred embodiment of the present invention. FIG. 18 is a circuit diagram illustrating the circuit configuration of the current sensor in the second preferred embodiment of the present invention. FIG. 17 does not illustrate the housing 150. FIG. 17 is a cross-sectional view similar to FIG. 7.

As illustrated in FIGS. 17 and 18, a current sensor 200 in the second preferred embodiment of the present invention includes a first magnetic sensor 220a and a second magnetic sensor 220b. The first magnetic sensor 220a is mounted on the main surface of a first substrate 230a. The second magnetic sensor 220b is mounted on the main surface of a second substrate 230b. The first substrate 230a is mounted on one main surface of the substrate 130. The main surface of the first substrate 230a and the one main surface of the substrate 130 are perpendicular or substantially perpendicular to each other. The second substrate 230b is mounted on the other main surface of the substrate 130. The main surface of the second substrate 230b and the other main surface of the substrate 130 are perpendicular or substantially perpendicular to each other. Each of the first substrate 230a and the second substrate 230b does not project to an outer side portion relative to the extending portion 114 of the arched portion 111 and the extending portion 119 of the inverted arched portion 116 in the thickness direction (Z-axis direction) of the primary conductor 110 when mounted on the substrate 130.

Each of the first magnetic sensor 220a and the second magnetic sensor 220b detects magnetic fields in the thickness direction (Z-axis direction) of the primary conductor 110. Specifically, each of the first magnetic sensor 220a and the second magnetic sensor 220b includes the detection axis 2 directing to the thickness direction (Z-axis direction) of the primary conductor 110.

Each of the first magnetic sensor 220a and the second magnetic sensor 220b preferably includes a Wheatstone bridge circuit including four AMR (Anisotropic Magneto Resistance) elements. Each of the first magnetic sensor 220a and the second magnetic sensor 220b may include magnetoresistive elements of GMR (Giant Magneto Resistance), TMR (Tunnel Magneto Resistance), BMR (Ballistic Magneto Resistance), CMR (Colossal Magneto Resistance), or other suitable magnetoresistive element, for example, instead of the AMR elements.

Furthermore, each of the first magnetic sensor 220a and the second magnetic sensor 220b may be a half-bridge circuit including two magnetoresistive elements. Alternatively, a magnetic sensor including an MI (Magneto Impedance) element utilizing a magnetic impedance effect, a flux-gate magnetic sensor, or other suitable sensors may be used for each of the first magnetic sensor 220a and the second magnetic sensor 220b. In addition, each of the first magnetic sensor 220a and the second magnetic sensor 220b may include a magnetic flux deflection element inducing a magnetic flux so as to pass therethrough in the direction of the detection axis 2. The magnetic flux deflection element is made of a magnetic material, such as Ni, for example, and converges flow of the magnetic flux into a constant direction.

In the present preferred embodiment, the AMR elements include preferably barber-pole electrodes and, thus, have odd function input/output characteristics. Specifically, the magnetoresistive elements of each of the first magnetic sensor 220a and the second magnetic sensor 220b preferably include the barber-pole electrodes and are, thus, biased such that the current flows in the direction with a predetermined angle (for example, about 45°) with respect to magnetization directions of magnetoresistive films of the magnetoresistive elements.

The magnetization direction of the magnetoresistive film is determined by at least one of shape anisotropy of the magnetoresistive film and a bias magnetic field. As a method for determining the magnetization direction of the AMR element, a method in which a permanent magnet or a thin film magnet is provided in the vicinity of the magnetoresistive film of the AMR element, a method in which exchange coupling or interphase coupling is provided in the magnetoresistive film, a method using an induction magnetic field of a coil provided in the vicinity of the magnetoresistive film, a method using a residual magnetic flux of a magnetic body provided in the vicinity of the magnetoresistive film, or other suitable method may be used. When the method using the induction magnetic field of the coil provided in the vicinity of the magnetoresistive film is used, the strength of the bias magnetic field that is applied to the magnetoresistive film is able to be appropriately adjusted by changing a magnitude of a current flowing through the coil. When the method in which the permanent magnet is provided in the vicinity of the magnetoresistive film is used, the permanent magnet may be a sintered magnet, a bond magnet, or a thin film, for example. The type of the permanent magnet is not particularly limited and a ferrite magnet, a samarium cobalt magnet, an alnico magnet, a neodymium magnet, or other suitable magnet may be used. The magnetoresistive film may be folded into a meandered shape.

The magnetization directions of the magnetoresistive films in the magnetoresistive elements of the first magnetic sensor 220a and the magnetization directions of the magnetoresistive films in the magnetoresistive elements of the second magnetic sensor 220b are preferably the same or substantially the same as each other. Lowering of the output accuracy due to influences of an external magnetic field is, thus, able to be decreased.

A power supply voltage that is applied to the bridge circuit of each of the first magnetic sensor 220a and the second magnetic sensor 220b may preferably be a constant voltage of a direct current, an AC voltage, or a pulse voltage, for example.

The current sensor 200 in the second preferred embodiment of the present invention can also be reduced in height, reduce the influences by the external magnetic field, and make frequency characteristics of the current sensor 200 preferable.

Third Preferred Embodiment

Hereinafter, a current sensor according to a third preferred embodiment of the present invention will be described with reference to the drawings. The current sensor in the present preferred embodiment is different from the current sensor 100 in the first preferred embodiment primarily in that all of the first magnetic sensor 120a, the second magnetic sensor 120b, the plurality of electronic components 140a, and the plurality of electronic components 140b are mounted on one main surface of the substrate 130. Therefore, description of the same configurations as those of the current sensor 100 in the first preferred embodiment is not repeated.

Figure 19:
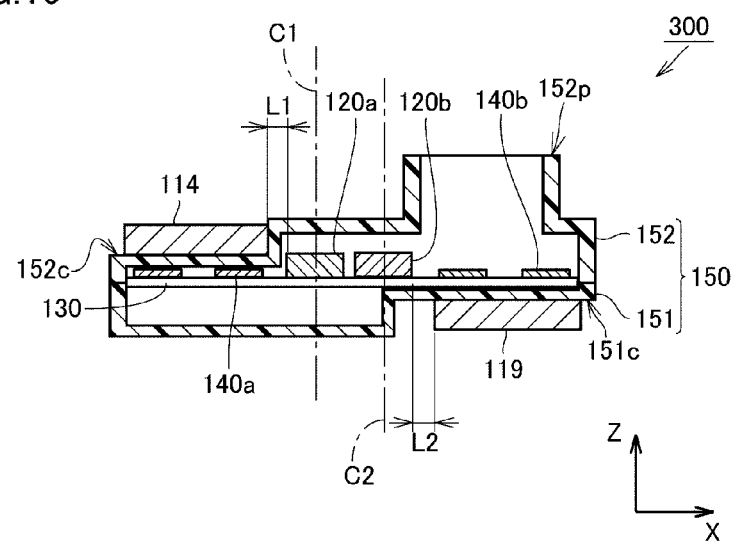
FIG. 19 is a cross-sectional view of a current sensor according to a third preferred embodiment of the present invention.

FIG. 19 is a cross-sectional view of the current sensor in the third preferred embodiment of the present invention. FIG. 19 is a cross-sectional view similar to FIG. 6. As illustrated in FIG. 19, in a current sensor 300 in the third preferred embodiment of the present invention, the first magnetic sensor 120a and the second magnetic sensor 120b are mounted on the one main surface of the substrate 130.

The first magnetic sensor 120a and the second magnetic sensor 120b are located so as to be aligned in the width direction (X-axis direction) of the primary conductor 110. The first magnetic sensor 120a and the second magnetic sensor 120b are arranged in the space between the arched portion 111 and the inverted arched portion 116 in the width direction (X-axis direction) of the primary conductor 110. In the present preferred embodiment, the space L1 between the first magnetic sensor 120a and the extending portion 114 of the arched portion 111 and the space L2 between the second magnetic sensor 120b and the extending portion 119 of the inverted arched portion 116 are preferably equal or substantially equal to each other in the width direction (X-axis direction) of the primary conductor 110. It should be noted that the space L1 and the space L2 may be different from each other.

The plurality of electronic components 140a are mounted on the one main surface of the substrate 130. The plurality of electronic components 140a are located at the other side in the width direction (X-axis direction) of the primary conductor 110 when viewed from the first magnetic sensor 120a. The plurality of electronic components 140b are mounted on the one main surface of the substrate 130. The plurality of electronic components 140b are located at one side in the width direction (X-axis direction) of the primary conductor 110 when viewed from the second magnetic sensor 120b.

Each of the plurality of electronic components 140a overlaps with the extending portion 114 of the arched portion 111 in the thickness direction (Z-axis direction) of the primary conductor 110. Each of the plurality of electronic components 140b overlaps with the extending portion 119 of the inverted arched portion 116 in the thickness direction (Z-axis direction) of the primary conductor 110.

Figure 20:
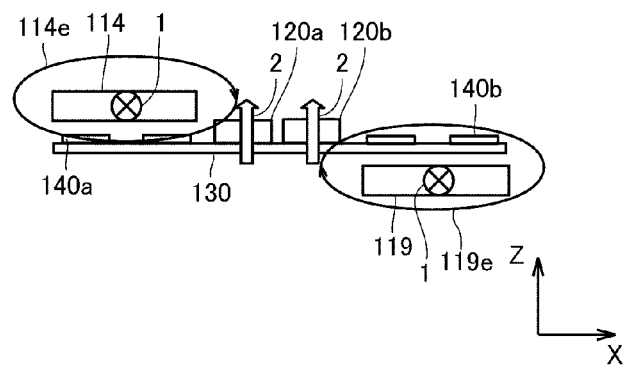
FIG. 20 is a cross-sectional view schematically illustrating magnetic fields generated by flow of a current as a measurement target in the current sensor in the third preferred embodiment of the present invention.

FIG. 20 is a cross-sectional view schematically illustrating magnetic fields generated by flow of a current as a measurement target in the current sensor in the third preferred embodiment of the present invention. FIG. 20 does not illustrate the housing 150. FIG. 20 is a cross-sectional view similar to FIG. 19.

As illustrated in FIG. 20, the magnetic field 114e revolving around the extending portion 114 is applied to the first magnetic sensor 120a. The magnetic field 119e revolving around the extending portion 119 is applied to the second magnetic sensor 120b.

The current sensor 300 in the third preferred embodiment of the present invention is also able to be reduced in height, reduce influences by an external magnetic field, and make frequency characteristics of the current sensor 300 preferable.

Furthermore, the first magnetic sensor 120*a* and the second magnetic sensor 120*b* are able to be mounted on the same main surface of the substrate 130. Therefore, the configuration of the current sensor 300 is simplified, reliability of the current sensor 300 is improved, and the assembly cost of the current sensor 300 is reduced. Moreover, when each of the first magnetic sensor 120*a* and the second magnetic sensor 120*b* is protected from electric fields generated around the primary conductor 110, both of the first magnetic sensor 120*a* and the second magnetic sensor 120*b* are able to be covered by one electrostatic shield plate for protection.

Fourth Preferred Embodiment

Hereinafter, a current sensor according to a fourth preferred embodiment of the present invention will be described. A current sensor 400 in the fourth preferred embodiment is different from the current sensor 100 in the first preferred embodiment primarily in the shapes of a first flow path portion and a second flow path portion. Therefore, the same reference signs denote the configurations that are the same or similar as those of the current sensor 100 in the first preferred embodiment and description thereof is not repeated.

Figure 21:
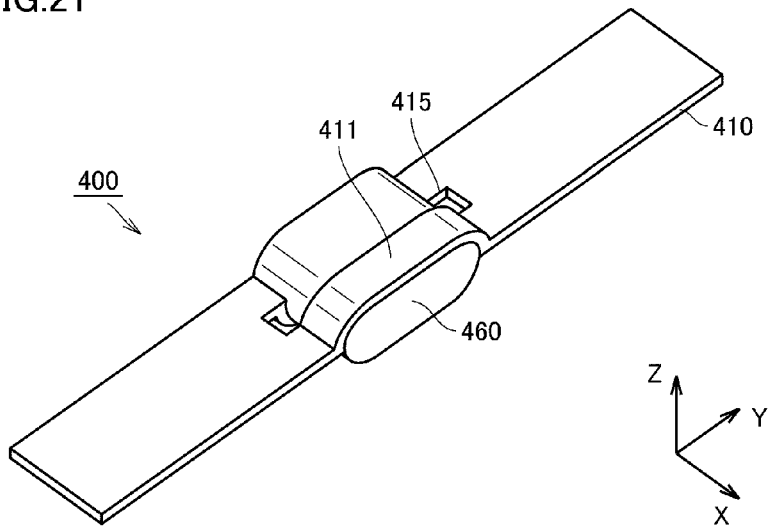
FIG. 21 is a perspective view illustrating an outer appearance of a current sensor according to a fourth preferred embodiment of the present invention.
Figure 22:
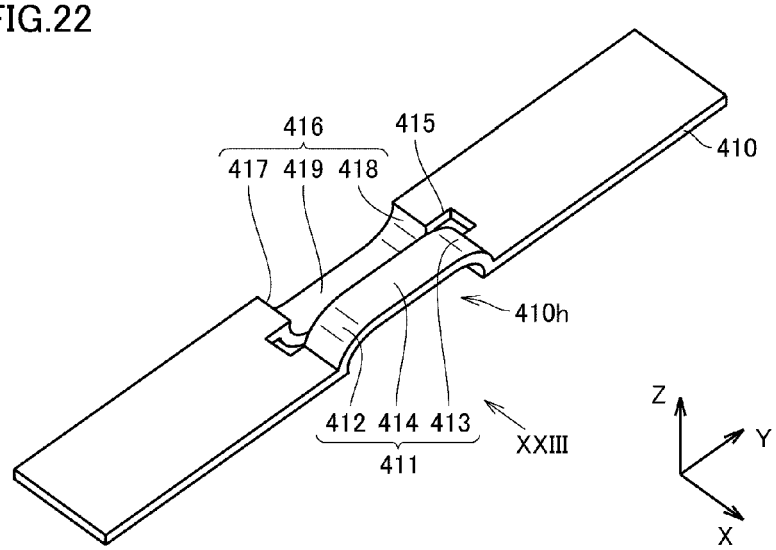
FIG. 22 is a perspective view illustrating an outer appearance of a primary conductor included in the current sensor in the fourth preferred embodiment of the present invention.
Figure 23:
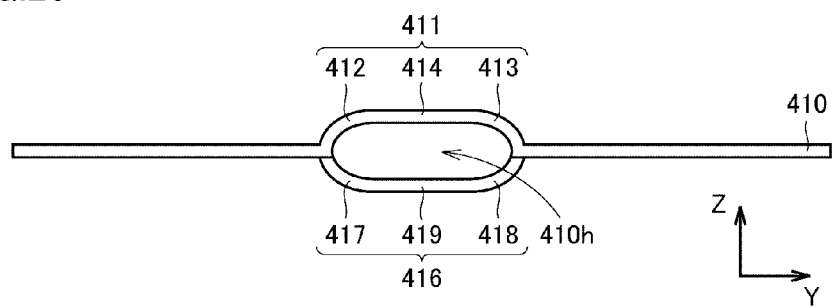
FIG. 23 is a side view when the primary conductor in FIG. 22 is viewed along a direction of an arrow XXIII.

FIG. 21 is a perspective view illustrating an outer appearance of the current sensor in the fourth preferred embodiment of the present invention. FIG. 22 is a perspective view illustrating an outer appearance of a primary conductor included in the current sensor in the fourth preferred embodiment of the present invention. FIG. 23 is a side view when the primary conductor in FIG. 22 is viewed along a direction of an arrow XXIII.

As illustrated in FIGS. 21 to 23, the current sensor 400 in the fourth preferred embodiment of the present invention includes a plate-shaped primary conductor 410 through which a current as a measurement target flows, and that includes a front surface and a rear surface, and a lengthwise direction (Y-axis direction), a width direction (X-axis direction) orthogonal or substantially orthogonal to the lengthwise direction (Y-axis direction), and a thickness direction (Z-axis direction) orthogonal or substantially orthogonal to the lengthwise direction (Y-axis direction) and the width direction (X-axis direction).

In the present preferred embodiment, a first flow path portion 411 projects towards the front surface side of the primary conductor 410 when viewed from the width direction (X-axis direction). A second flow path portion 416 projects towards the rear surface side of the primary conductor 410 when viewed from the width direction (X-axis direction). The second flow path portion 416 is aligned with the first flow path portion 411 in the width direction (X-axis direction) of the primary conductor 410. A region 410*h* surrounded by the first flow path portion 411 and the second flow path portion 416 is provided when viewed from the width direction (X-axis direction). A slit 415 is located at the center or approximate center of the primary conductor 410 in the width direction (X-axis direction) of the primary conductor 410.

Each of the first flow path portion 411 and the second flow path portion 416 preferably has a semi-oval shape when viewed from the width direction (X-axis direction) of the primary conductor 410. The first flow path portion 411 includes a first projecting portion 412 and a second projecting portion 413 projecting in a circular arc shape from the front surface of the primary conductor 410 with a space therebetween and an extending portion 414 extending in the lengthwise direction (Y-axis direction) of the primary conductor 410 and connecting the first projecting portion 412 and the second projecting portion 413. The second flow path portion 416 includes a third projecting portion 417 and a fourth projecting portion 418 projecting in a circular arc shape from the rear surface of the primary conductor 410 with a space therebetween and an extending portion 419 extending in the lengthwise direction (Y-axis direction) of the primary conductor 410 and connecting the third projecting portion 417 and the fourth projecting portion 418.

A magnetic sensor unit 460 is inserted into a space defined by the first flow path portion 411 and the second flow path portion 416. With this configuration, the first magnetic sensor 120*a* and the second magnetic sensor 120*b* are arranged in the space between the first flow path portion 411 and the second flow path portion 416 in the width direction (X-axis direction) of the primary conductor 410.

One main surface of the substrate 130 opposes the rear surface of the extending portion 414 of the first flow path portion 411 in an inner side portion of the first flow path portion 411 when the magnetic sensor unit 460 is assembled on the primary conductor 410. The other main surface of the substrate 130 opposes the surface of the extending portion 419 of the second flow path portion 416. That is, the substrate 130 is located in the above-described region and opposes both of the first flow path portion 411 and the second flow path portion 416 when viewed from the width direction (X-axis direction) of the primary conductor 410. The arrangement of the substrate 130 is, however, not limited to the above-described arrangement and it is sufficient that at least a portion of the substrate 130 is located in the above-described region and opposes at least one of the first flow path portion 411 and the second flow path portion 416 when viewed from the width direction (X-axis direction) of the primary conductor 410.

The current sensor 400 in the present preferred embodiment is also able to be reduced in height, reduce influences by an external magnetic field, and produce frequency characteristics of the current sensor 400 that are preferable.

Figure 24:
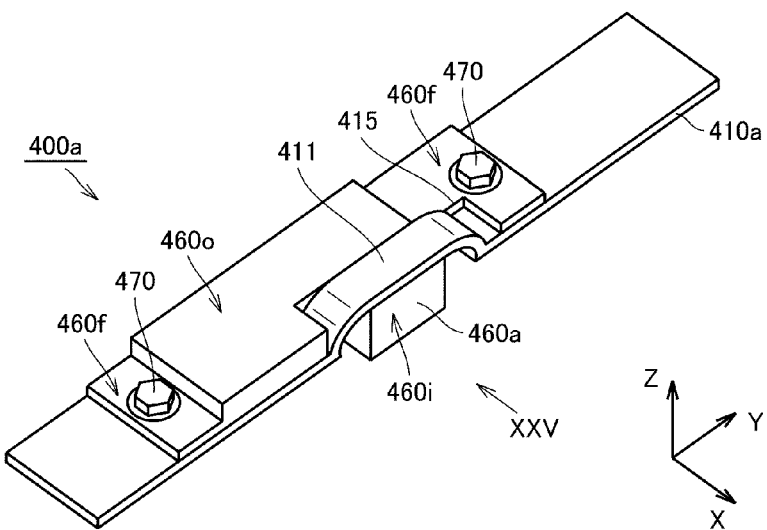
FIG. 24 is a perspective view illustrating an outer appearance of a current sensor according to a modification of the fourth preferred embodiment of the present invention.
Figure 25:
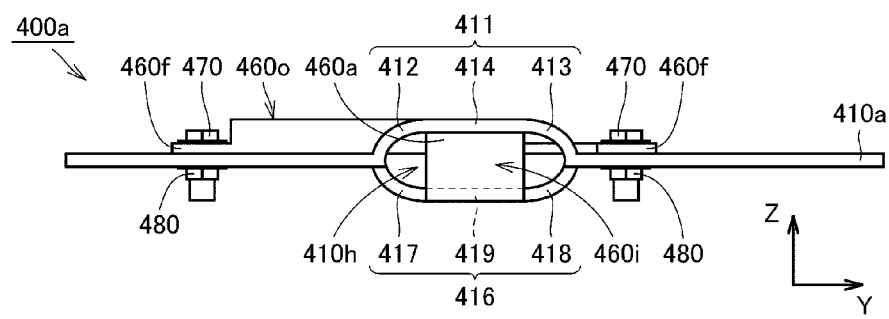
FIG. 25 is a side view when the current sensor in FIG. 24 is viewed along a direction of an arrow XXV.
Figure 26:
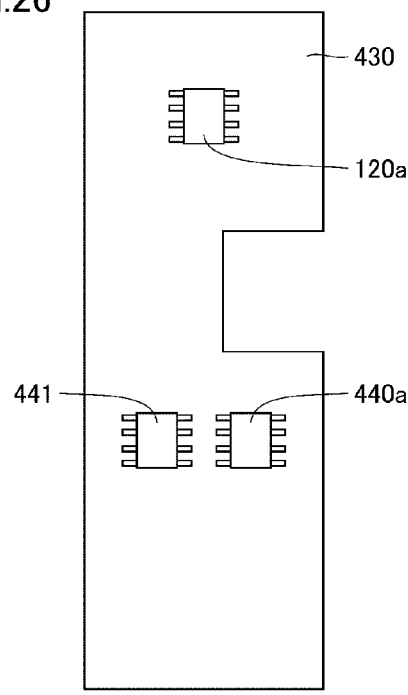
FIG. 26 is a view when a substrate of a magnetic sensor unit included in the current sensor in the modification of the fourth preferred embodiment of the present invention is viewed from the front surface side.
Figure 27:
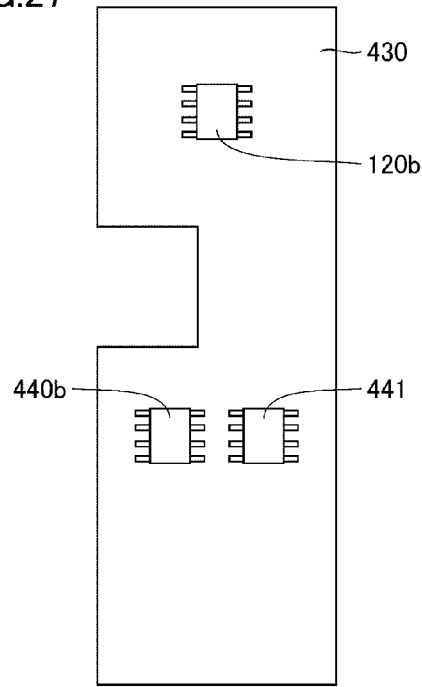
FIG. 27 is a view when the substrate of the magnetic sensor unit included in the current sensor in the modification of the fourth preferred embodiment of the present invention is viewed from the rear surface side.

A portion of the magnetic sensor unit 460 may be arranged in an outer side portion of the space defined by the first flow path portion 411 and the second flow path portion 416. FIG. 24 is a perspective view illustrating an outer appearance of a current sensor according to a modification of the fourth preferred embodiment of the present invention. FIG. 25 is a side view when the current sensor in FIG. 24 is viewed along a direction of an arrow XXV. FIG. 26 is a view when a substrate of a magnetic sensor unit included in the current sensor in the variation on the fourth preferred embodiment of the present invention is viewed from the front surface side. FIG. 27 is a view when the substrate of the magnetic sensor unit included in the current sensor in the variation on the fourth preferred embodiment of the present invention is viewed from the rear surface side.

As illustrated in FIGS. 24 and 25, a current sensor 400*a* in the modification of the fourth preferred embodiment of the present invention includes a primary conductor 410*a* and a magnetic sensor unit 460*a*. The magnetic sensor unit 460*a* includes a magnetic sensor accommodation portion 460*i* located in the region 410*h*, an electronic component accommodation portion 460*o* located in an outer side portion of the region 410*h*, and flange portions 460*f* when viewed from the width direction (X-axis direction).

As illustrated in FIGS. 26 and 27, electronic components 440*a* and 441 are mounted on the front surface of a substrate 430 and electronic components 440*b* and 441 are mounted on the rear surface of the substrate 430 in a portion which is located in the electronic component accommodation portion 460*o*. The electronic components 440*a*, 440*b*, and 441 define an operation circuit. The first magnetic sensor 120*a* is mounted on the front surface of the substrate 430 and the second magnetic sensor 120*b* is mounted on the rear surface of the substrate 430 in a portion which is located in the magnetic sensor accommodation portion 460*i*.

Through-holes (not illustrated) are provided in the flange portions 460*f*. Through-holes (not illustrated) are provided in the primary conductor 410*a* at positions corresponding to the through-holes of the flange portions 460*f*. Bolts 470 inserted through the through-holes of the flange portions 460*f* and the through-holes of the primary conductors 410*a* and nuts 480 are screwed together, thus fastening the magnetic sensor unit 460*a* and the primary conductor 410*a* to each other. Each of the bolts 470 and the nuts 480 is preferably made of a non-magnetic material.

In the current sensor 400*a* in the modification of the fourth preferred embodiment of the present invention, the magnetic sensor unit 460*a* is able to be reliably attached to the primary conductor 410*a* with the bolts 470 and the nuts 480. Furthermore, the electronic components 440*a*, 440*b*, and 441 defining the operation circuit are arranged in the outer side portion of the region 410*h*, thus reducing the size of the region 410*h*. The reduction of the size of the region 410*h* enables a decrease in a distance between the first flow path portion 411 and the first magnetic sensor 120*a* and a distance between the second flow path portion 416 and the second magnetic sensor 120*b*, thus further reducing the height of the current sensor 400*a* and reducing influences by an external magnetic field.

Fifth Preferred Embodiment

Hereinafter, a current sensor according to a fifth preferred embodiment of the present invention will be described. A current sensor 500 in the fifth preferred embodiment is different from the current sensor 100 in the first preferred embodiment primarily in the shapes of the first flow path portion and the second flow path portion. Therefore, the same reference signs denote the configurations that are the same or similar as those of the current sensor 100 in the first preferred embodiment and description thereof is not repeated.

Figure 28:
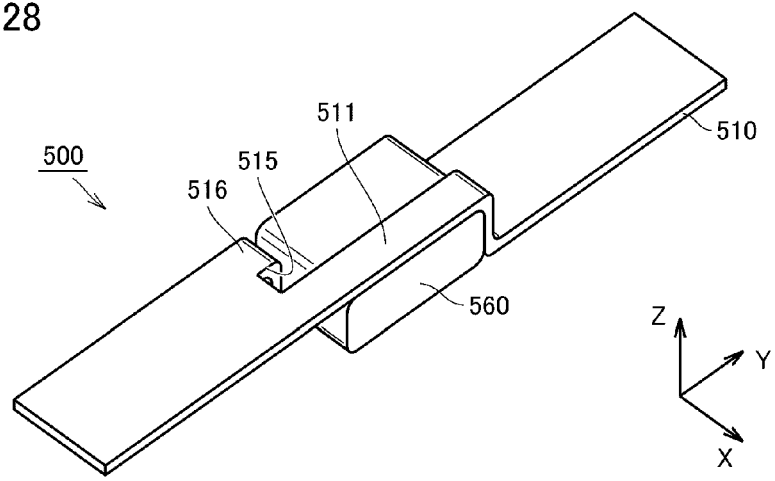
FIG. 28 is a perspective view illustrating an outer appearance of a current sensor according to a fifth preferred embodiment of the present invention.
Figure 29:
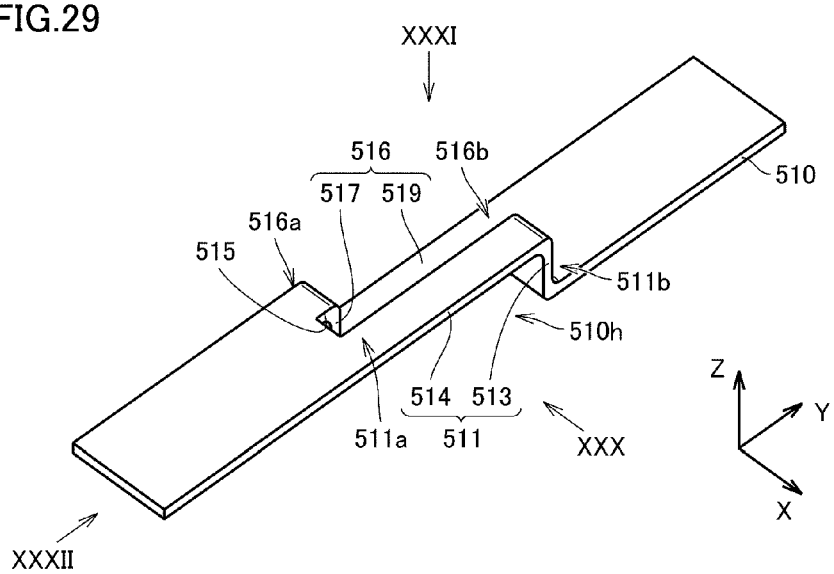
FIG. 29 is a perspective view illustrating an outer appearance of a primary conductor included in the current sensor in the fifth preferred embodiment of the present invention.
Figure 30:
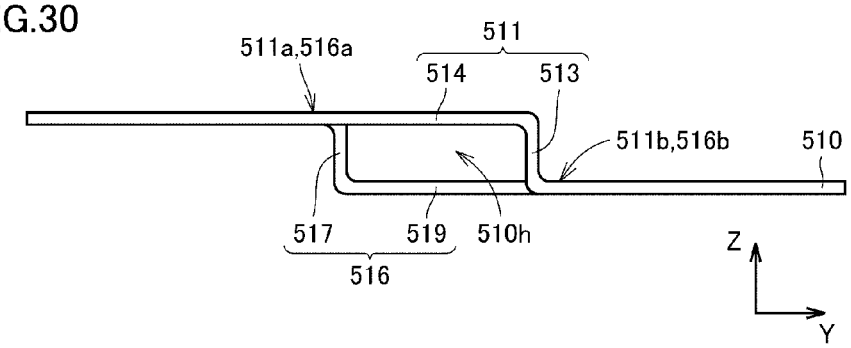
FIG. 30 is a side view when the primary conductor in FIG. 29 is viewed along a direction of an arrow XXX.

FIG. 28 is a perspective view illustrating an outer appearance of the current sensor in the fifth preferred embodiment of the present invention. FIG. 29 is a perspective view illustrating an outer appearance of a primary conductor included in the current sensor in the fifth preferred embodiment of the present invention. FIG. 30 is a side view when the primary conductor in FIG. 29 is viewed along a direction of an arrow XXX. FIG. 31 is a top view when the primary conductor in FIG. 29 is viewed along a direction of an arrow XXXI. FIG. 32 is a front view when the primary conductor in FIG. 29 is viewed along a direction of an arrow XXXII.

As illustrated in FIGS. 28 to 32, the current sensor 500 in the fifth preferred embodiment of the present invention includes a plate-shaped primary conductor 510 through which a current as a measurement target flows, and that includes a front surface and a rear surface, and a lengthwise direction (Y-axis direction), a width direction (X-axis direction) orthogonal or substantially orthogonal to the lengthwise direction (Y-axis direction), and a thickness direction (Z-axis direction) orthogonal or substantially orthogonal to the lengthwise direction (Y-axis direction) and the width direction (X-axis direction).

In the present preferred embodiment, a second flow path portion 516 is aligned with a first flow path portion 511 in the width direction (X-axis direction) of the primary conductor 510. A region 510*h* surrounded by the first flow path portion 511 and the second flow path portion 516 is provided when viewed from the width direction (X-axis direction). A slit 515 is located at the center or approximate center of the primary conductor 510 in the width direction (X-axis direction) of the primary conductor 510.

The first flow path portion 511 includes one end 511*a* and the other end 511*b* in the lengthwise direction (Y-axis direction). The second flow path portion 516 includes one end 516*a* and the other end 516*b* in the lengthwise direction (Y-axis direction). The one end 511*a* of the first flow path portion 511 and the one end 516*a* of the second flow path portion 516 are aligned in the width direction (X-axis direction) with the slit 515 interposed therebetween. The other end 511*b* of the first flow path portion 511 and the other end 516*b* of the second flow path portion 516 are aligned in the width direction (X-axis direction) with the slit 515 interposed therebetween.

Positions of the one end 511*a* of the first flow path portion 511 and the other end 511*b* of the first flow path portion 511 in the lengthwise direction (Y-axis direction) are different from each other in the thickness direction (Z-axis direction). Positions of the one end 516*a* of the second flow path portion 516 and the other end 516*b* of the second flow path portion 516 in the lengthwise direction (Y-axis direction) are different from each other in the thickness direction (Z-axis direction). The positions of the one end 511*a* of the first flow path portion 511 and the one end 516*a* of the second flow path portion 516 in the lengthwise direction (Y-axis direction) are the same or substantially the same as each other in the thickness direction (Z-axis direction). The positions of the other end 511*b* of the first flow path portion 511 and the other end 516*b* of the second flow path portion 516 in the lengthwise direction (Y-axis direction) are the same or substantially the same as each other in the thickness direction (Z-axis direction).

The first flow path portion 511 includes a bent portion 513 connecting the position of the one end 511*a* of the first flow path portion 511 and the position of the other end 511*b* of the first flow path portion 511 in the thickness direction (Z-axis direction). The second flow path portion 516 includes a bent portion 517 connecting the position of the one end 516*a* of the second flow path portion 516 and the position of the other end 516*b* of the second flow path portion 516 in the thickness direction (Z-axis direction). The bent portion 513 of the first flow path portion 511 and the bent portion 517 of the second flow path portion 516 are located with a space therebetween in the lengthwise direction (Y-axis direction).

In the present preferred embodiment, the first flow path portion 511 includes an extending portion 514 extending in the lengthwise direction (Y-axis direction) from the one end 511*a* and the bent portion 513 extending in the thickness direction (Z-axis direction) from an end portion of the extending portion 514 in the lengthwise direction (Y-axis direction) towards the other end 511*b*. That is, the first flow path portion 511 preferably has a step shape. The extending portion 514 contacts the one end 511*a* of the first flow path portion 511. The bent portion 513 contacts the other end 511*b* of the first flow path portion 511. The shape of the bent portion 513 is not limited to the above-described shape and the bent portion 513 may extend in the direction intersecting with each of the lengthwise direction (Y-axis direction) and the thickness direction (Z-axis direction) or may be curved when viewed from the width direction (X-axis direction).

The second flow path portion 516 includes the bent portion 517 extending in the thickness direction (Z-axis direction) from the one end 516a and an extending portion 519 extending in the lengthwise direction (Y-axis direction) from the end portion of the bent portion 517 in the thickness direction (Z-axis direction) towards the other end 516b. That is, the second flow path portion 516 preferably has a step shape. The extending portion 519 contacts the other end 516b of the second flow path portion 516. The bent portion 517 contacts the one end 516a of the second flow path portion 516. The shape of the bent portion 517 is not limited to the above-described shape and the bent portion 517 may extend in the direction intersecting with each of the lengthwise direction (Y-axis direction) and the thickness direction (Z-axis direction) or may be curved when viewed from the width direction (X-axis direction).

A magnetic sensor unit 560 is inserted into a space defined by the first flow path portion 511 and the second flow path portion 516. With this configuration, the first magnetic sensor 120a and the second magnetic sensor 120b are arranged in the space between the first flow path portion 511 and the second flow path portion 516 in the width direction (X-axis direction) of the primary conductor 510.

One main surface of the substrate 130 opposes the rear surface of the extending portion 514 of the first flow path portion 511 in an inner side portion of the first flow path portion 511 when the magnetic sensor unit 560 is assembled on the primary conductor 510. The other main surface of the substrate 130 opposes the front surface of the extending portion 519 of the second flow path portion 516. That is, the substrate 130 is located in the above-described region and opposes both of the first flow path portion 511 and the second flow path portion 516 when viewed from the width direction (X-axis direction) of the primary conductor 510. The arrangement of the substrate 130 is, however, not limited to the above-described arrangement and it is sufficient that at least a portion of the substrate 130 is located in the above-described region and opposes at least one of the first flow path portion 511 and the second flow path portion 516 when viewed from the width direction (X-axis direction) of the primary conductor 510.

The current sensor 500 in the present preferred embodiment is also able to be reduced in height, reduce influences by an external magnetic field, and make frequency characteristics of the current sensor 500 preferable.

Sixth Preferred Embodiment

Figure 33:
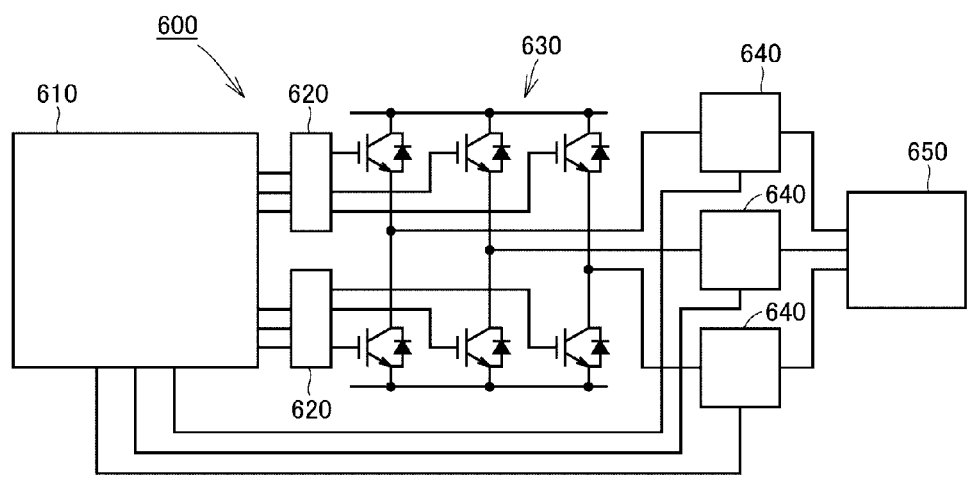
FIG. 33 is a circuit diagram illustrating the configuration of a power conversion apparatus according to a sixth preferred embodiment of the present invention.

Hereinafter, a power conversion apparatus according to a sixth preferred embodiment of the present invention will be described with reference to the drawings. FIG. 33 is a circuit diagram illustrating the configuration of the power conversion apparatus in the sixth preferred embodiment of the present invention. As illustrated in FIG. 33, a power conversion apparatus 600 in the sixth preferred embodiment of the present invention includes a controller 610, switch driving units 620, a switch element portion 630, current sensors 640, and an output portion 650 that are electrically connected to one another. The current sensors 640 are current sensors according to any one of the preferred embodiments of the present invention. The power conversion apparatus 600 is preferably, for example, an inverter. The output portion 650 is preferably, for example, an AC motor. It should be noted that the power conversion apparatus 600 may be a converter and the output portion 650 may be a DC motor.

The power conversion apparatus 600 includes the current sensors 640, so that the controller 610 is able to control output of the output portion 650 based on measurement results with high accuracy by the current sensors 640. Therefore, adjustment accuracy of the power conversion apparatus 600 is able to be improved. Furthermore, the heights of the current sensors 640 are reduced, thus reducing the size of the power conversion apparatus 600n size.

In description of the above-described preferred embodiments, the components may be combined with each other.

While preferred embodiments of the present invention have been described above, it is to be understood that variations and modifications will be apparent to those skilled in the art without departing from the scope and spirit of the present invention. The scope of the present invention, therefore, is to be determined solely by the following claims.

What is claimed is:

1. A current sensor comprising:
a conductor through which an electric current as a measurement target flows and that includes a front surface, a rear surface, a lengthwise direction, a width direction orthogonal or substantially orthogonal to the lengthwise direction, and a thickness direction orthogonal or substantially orthogonal to the lengthwise direction and the width direction;
a first magnetic sensor and a second magnetic sensor that detect an intensity of a magnetic field generated by the current flowing through the conductor; and
a substrate on which the first magnetic sensor and the second magnetic sensor are mounted; wherein
the conductor includes a first flow path portion and a second flow path portion through which the current flows in a branched manner at a central portion in the lengthwise direction;
a space is provided between the first flow path portion and the second flow path portion in the width direction when viewed from the thickness direction;
a region surrounded by the first flow path portion and the second flow path portion is provided when viewed from the width direction;
at least a portion of the substrate is located in the region and opposes at least one of the first flow path portion and the second flow path portion when viewed from the width direction;
the first magnetic sensor and the second magnetic sensor are arranged in the space;
the first magnetic sensor is mounted on a first main surface of the substrate; and
the second magnetic sensor is mounted on a second main surface of the substrate opposite to the first main surface.

2. The current sensor according to claim 1, wherein the first flow path portion projects towards a side of the front surface of the conductor when viewed from the width direction.

3. The current sensor according to claim 2, wherein the second flow path portion projects towards a side of the rear surface of the conductor when viewed from the width direction.

4. The current sensor according to claim 1, wherein
each of the first flow path portion and the second flow path portion includes a first end and a second end in the lengthwise direction;
positions of the first end of the first flow path portion and the second end of the first flow path portion in the lengthwise direction are different from each other in the thickness direction;

positions of the first end of the second flow path portion and the second end of the second flow path portion in the lengthwise direction are different from each other in the thickness direction;

the positions of the first end of the first flow path portion and the second end of the second flow path portion in the lengthwise direction are the same or substantially the same as each other in the thickness direction;

the positions of the second end of the first flow path portion and the second end of the second flow path portion in the lengthwise direction are the same or substantially the same as each other in the thickness direction;

the first flow path portion includes a bent portion connecting the position of the first end of the first flow path portion and the position of the second end of the first flow path portion in the thickness direction;

the second flow path portion includes a bent portion connecting the position of the first end of the second flow path portion and the position of the second end of the second flow path portion in the thickness direction; and a space is provided between the bent portion of the first flow path portion and the bent portion of the second flow path portion in the lengthwise direction.

5. The current sensor according to claim 1, wherein
the first magnetic sensor overlaps with at least a portion of the first flow path portion when viewed from the width direction; and
the second magnetic sensor overlaps with at least a portion of the second flow path portion when viewed from the width direction.

6. The current sensor according to claim 1, wherein the first magnetic sensor and the second magnetic sensor overlap with each other when viewed from the thickness direction.

7. The current sensor according to claim 1, wherein
a space between the first magnetic sensor and the first flow path portion and a space between the second magnetic sensor and the second flow path portion are equal or substantially equal to each other in the width direction; and
the first magnetic sensor and the second magnetic sensor deviate from each other in the lengthwise direction when viewed from the thickness direction.

8. The current sensor according to claim 1, further comprising:
a calculator that calculates a value of the current by using a detection value of the first magnetic sensor and a detection value of the second magnetic sensor; wherein
a phase of the detection value of the first magnetic sensor and a phase of the detection value of the second magnetic sensor are opposite to each other; and
the calculator is a subtractor or a differential amplifier.

9. The current sensor according to claim 1, further comprising:
a calculator that calculates a value of the current by using a detection value of the first magnetic sensor and a detection value of the second magnetic sensor; wherein
a phase of the detection value of the first magnetic sensor and a phase of the detection value of the second magnetic sensor are the same as each other; and
the calculator is an adder or a summing amplifier.

10. The current sensor according to claim 8, wherein
the calculator is mounted on at least one of the first main surface of the substrate and the second main surface of the substrate; and
the calculator overlaps with at least one of the first flow path portion and the second flow path portion in the thickness direction.

11. The current sensor according to claim 9, wherein
the calculator is mounted on at least the first main surface of the substrate and the second main surface of the substrate; and
the calculator overlaps with at least one of the first flow path portion and the second flow path portion in the thickness direction.

12. The current sensor according to claim 1, wherein each of the first magnetic sensor and the second magnetic sensor includes a Hall element.

13. The current sensor according to claim 1, wherein each of the first magnetic sensor and the second magnetic sensor includes a magnetoresistive element.

14. The current sensor according to claim 1, wherein the first flow path portion is defined by an arched portion.

15. The current sensor according to claim 1, wherein the second flow path portion is defined by an inverted arched portion.

16. The current sensor according to claim 14, wherein the arched portion includes:
a first projecting portion and a second projecting portion projecting so as to be orthogonal or substantially orthogonal to the front surface of the conductor; and
an extending portion extending in the lengthwise direction of the conductor and connecting the first projecting portion and the second projecting portion.

17. The current sensor according to claim 15, wherein the inverted arched portion includes:
a third projecting portion and a fourth projecting portion projecting so as to be orthogonal or substantially orthogonal to the front surface of the conductor; and
an extending portion extending in the lengthwise direction of the conductor and connecting the third projecting portion and the fourth projecting portion.

18. A power conversion apparatus comprising the current sensor according to claim 1.

* * * * *